US009782830B2

(12) United States Patent
Okude et al.

(10) Patent No.: US 9,782,830 B2
(45) Date of Patent: Oct. 10, 2017

(54) SURFACE-COATED CUTTING TOOL

(71) Applicant: MITSUBISHI MATERIALS CORPORATION, Tokyo (JP)

(72) Inventors: Masaki Okude, Naka-gun (JP); Kenji Yamaguchi, Naka-gun (JP); Akira Osada, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 55 days.

(21) Appl. No.: 14/770,304

(22) PCT Filed: Feb. 26, 2014

(86) PCT No.: PCT/JP2014/054663
§ 371 (c)(1),
(2) Date: Aug. 25, 2015

(87) PCT Pub. No.: WO2013/132995
PCT Pub. Date: Sep. 4, 2014

(65) Prior Publication Data
US 2016/0001375 A1    Jan. 7, 2016

(30) Foreign Application Priority Data

Feb. 26, 2013  (JP) .................................. 2013-035566
Feb. 24, 2014  (JP) .................................. 2014-032483

(51) Int. Cl.
*B23B 27/14*   (2006.01)
*C23C 16/36*   (2006.01)
(Continued)

(52) U.S. Cl.
CPC ............ *B23B 27/148* (2013.01); *C23C 16/36* (2013.01); *C23C 16/403* (2013.01);
(Continued)

(58) Field of Classification Search
USPC .......... 51/307, 309; 428/216, 336, 697, 698, 428/699, 701, 702
See application file for complete search history.

(56) References Cited

U.S. PATENT DOCUMENTS

| 2004/0076857 A1 | 4/2004 | Sjolen et al. |
| 2006/0115650 A1 | 6/2006 | Hanyu et al. |

(Continued)

FOREIGN PATENT DOCUMENTS

| CN | 1481971 A | 3/2004 |
| CN | 1638900 A | 7/2005 |

(Continued)

OTHER PUBLICATIONS

Office Action mailed May 27, 2016 for the corresponding Chinese Patent Application No. 201480010228.7.
(Continued)

*Primary Examiner* — Archene Turner
(74) *Attorney, Agent, or Firm* — Leason Ellis LLP

(57) ABSTRACT

A surface-coated cutting tool includes a lower layer including a Ti compound layer, an intermediate layer including an $\alpha\text{-Al}_2\text{O}_3$ layer, and an upper layer including a Zr-containing $\alpha\text{-Al}_2\text{O}_3$ layer. The outermost layer of the lower layer contains 0.5 to 3 at % of oxygen. The frequencies of inclination angles between a normal line to a (0001) plane of $\text{Al}_2\text{O}_3$ grains of the intermediate layer and a normal line to a surface of a tool body have a highest peak in an inclination angle division of 0 to 10°. The ratio of the frequencies is 50 to 70%. The frequencies between the normal line to the (0001) plane of $\text{Al}_2\text{O}_3$ grains of the entirety of the intermediate and the upper layers and the normal line to the tool body surface have a highest peak in an inclination angle division of 0 to 10°. The ratio of the frequencies is 75% or more.

8 Claims, 5 Drawing Sheets

(51) Int. Cl.
   *C23C 16/40*   (2006.01)
   *C23C 16/56*   (2006.01)
   *C23C 28/04*   (2006.01)
   *C23C 30/00*   (2006.01)

(52) U.S. Cl.
   CPC ............ *C23C 16/405* (2013.01); *C23C 16/56* (2013.01); *C23C 28/04* (2013.01); *C23C 28/042* (2013.01); *C23C 28/044* (2013.01); *C23C 30/00* (2013.01); *B23B 2224/04* (2013.01); *B23B 2224/28* (2013.01); *B23B 2224/32* (2013.01); *B23B 2224/36* (2013.01); *B23B 2228/105* (2013.01)

(56) References Cited

U.S. PATENT DOCUMENTS

| | | | |
|---|---|---|---|
| 2007/0292670 A1 | 12/2007 | Okada et al. | |
| 2012/0003452 A1* | 1/2012 | Tomita | C23C 16/0272 428/216 |

FOREIGN PATENT DOCUMENTS

| | | | |
|---|---|---|---|
| CN | 102794492 A | | 11/2012 |
| EP | 1952920 A | | 8/2008 |
| EP | 2006040 A | | 12/2008 |
| EP | 2409798 A | | 1/2012 |
| JP | 06-008010 A | | 1/1994 |
| JP | 2006-289557 A | | 10/2006 |
| JP | 2009-006425 | * | 10/2009 |
| JP | 2009-279694 A | | 12/2009 |
| JP | 2010-110833 A | | 5/2010 |
| JP | 2011-200953 A | | 10/2011 |
| JP | 2013-111720 A | | 6/2013 |
| JP | 2013-188833 A | | 9/2013 |
| WO | WO-2006/046498 A | | 5/2006 |

OTHER PUBLICATIONS

International Search Report mailed Apr. 8, 2014 for the corresponding PCT Application No. PCT/JP2014/054663.

Extended European Search Report mailed Aug. 31, 2016 for the corresponding European Pat. No. 14756638.4.

* cited by examiner

5 μm

5 μm

5 μm

5 μm

SURFACE-COATED CUTTING TOOL

CROSS-REFERENCE TO RELATED PATENT APPLICATIONS

This application is a U.S. National Phase Application under 35 U.S.C. §371 of International Patent Application No. PCT/JP2014/054663, filed Feb. 26, 2014, and claims the benefit of Japanese Patent Applications No. 2013-035566, filed Feb. 26, 2013 and No. 2014-032483, filed Feb. 24, 2014, all of which are incorporated by reference in their entirety herein. The International Application was published in Japanese on Sep. 4, 2014 as International Publication No. WO/2014/132995 under PCT Article 21(2).

FIELD OF THE INVENTION

The present invention relates to a surface-coated cutting tool in which a hard coating layer exhibits excellent peeling resistance and chipping resistance during high-speed intermittent heavy cutting work. Specifically, the present invention relates to a surface-coated cutting tool (hereinafter, referred to as a coated tool) in which a hard coating layer exhibits excellent peeling resistance and chipping resistance and which exhibits excellent wear resistance over a long period of time, even in a case where cutting work of various types of steels, cast iron, or the like is performed under high-speed intermittent heavy cutting conditions in which a high impact load is applied intermittently to a cutting edge at a high speed.

BACKGROUND OF THE INVENTION

Hitherto, in general, a coated tool is known, in which a hard coating layer is vapor-deposited on the surface of a body (hereinafter, collectively referred to as a tool body) made of tungsten carbide (hereinafter, referred to as WC)-based cemented carbide or titanium carbonitride (hereinafter, referred to as TiCN)-based cermet, the hard coating layer including:

(a) as a lower layer, a Ti compound layer composed of one or more of a Ti carbide (hereinafter, referred to as TiC) layer, a Ti nitride (hereinafter, similarly referred to as TiN) layer, a Ti carbonitride (hereinafter, referred to as TiCN) layer, a Ti oxycarbide (hereinafter, referred to as TiCO) layer, and a Ti oxycarbonitride (hereinafter, referred to as TiCNO) layer; and (b) as an upper layer, an aluminum oxide layer (hereinafter, referred to as an $Al_2O_3$ layer) having an α-crystal structure in a chemically vapor-deposited state.

The conventional coated tool exhibits excellent wear resistance, for example, during continuous cutting or intermittent cutting of various types of steels or cast iron. However, in a case where the coated tool is used for high-speed intermittent cutting, there is a problem in that peeling or chipping of the coating layer easily occurs and the service life of the tool is reduced.

In order to suppress peeling or chipping of the coating layer, various coated tools with improved upper layers have been proposed.

For example, in Japanese Unexamined Patent Application, First Publication No. 2006-289557, a coated tool is proposed, in which a hard coating layer is vapor-deposited on the surface of a tool body, the hard coating layer including:

(a) as a lower layer, a Ti compound layer composed of one or more of a TiC layer, a TiN layer, a TiCN layer, a TiCO layer, and a TiCNO layer, and having an average total layer thickness of 3 to 20 μm; and (b) as an upper layer, a modified Al—Zr complex oxide layer having an average layer thickness of 1 to 15 μm and an α-crystal structure in a chemically vapor-deposited state, satisfying a composition formula of $(Al_{1-X}Zr_X)_2O_3$ (X:0.003 to 0.05 in terms of atomic ratio), and having properties indicated by a constituent atom-sharing lattice point distribution graph in which the highest peak exists at Σ3 and the distribution ratio of Σ3 to the entire ΣN+1 is 60 to 80%. The constituent atom-sharing lattice point distribution graph is obtained by utilizing a field-emission-type scanning electron microscope, irradiating electron beams to individual crystal grains with a hexagonal crystal lattice in a measurement range of a polished surface, measuring an inclination angle between the normal line to the polished surface and the normal lines to a (0001) plane and a (10-10) plane as a crystal planes of the crystal grains which have a corundum hexagonal close-packed crystal structure in which constituent atoms composed of Al, Zr, and oxygen are present at each of the lattice points, and calculating a distribution of lattice points (constituent atom-sharing lattice points) where each constituent atom shares one constituent atom interface between the adjacent crystal grains based on the resulting measured inclination angles; and the graph shows the distribution ratio of individual ΣN+1 to the entire ΣN+1, ΣN+1 representing a constituent atom-sharing lattice point type in which there are N lattice points sharing no constituent atoms between the constituent atom-sharing lattice points (here, N is an even number of 2 or higher in a crystal structure of a corundum-type hexagonal close-packing crystal, and, 4, 8, 14, 24, and 26 do not exist from the view point of a distribution frequency in a case where the upper limit of N is 28).

It is known that chipping resistance is improved by the coated tool during high-speed intermittent cutting work.

In addition, for example, in Japanese Unexamined Patent Application, First Publication No. 2010-110833, a surface-coated cutting tool is proposed, in which a hard coating layer is vapor-deposited on the surface of a tool body, the hard coating layer including:

(a) as a lower layer, a Ti compound layer composed of one or more of a TiC layer, a TiN layer, a TiCN layer, a TiCO layer, and a TiCNO layer, and having an average total layer thickness of 3 μm to 20 μm;

(b) as an intermediate layer, an $Al_2O_3$ layer having an average layer thickness of 1 to 5 μm and having an α-crystal structure in a chemically vapor-deposited state; and (c) as an upper layer, a Zr-containing $Al_2O_3$ layer having an average layer thickness of 2 to 15 μm and having an α-crystal structure in a chemically vapor-deposited state.

In this tool, the intermediate layer (b) has properties indicated by an inclination angle frequency distribution graph in which the highest peak exists in an inclination angle division ranging 0 to 10° and the total sum of frequencies in the range of 0 to 10° occupies a ratio of 45% or more of the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished surface of the tool body, measuring an inclination angle between the normal line to the polished surface and the normal line to (0001) plane as a crystal plane of the crystal grains, dividing the measured inclination angles belonging to a range of 0 to 45° every pitch of 0.25°, and counting the frequencies in each division;

the upper layer (c) has properties indicated by an inclination angle frequency distribution graph in which the highest peak exists in an inclination angle division in the range of 0 to 10° and the sum of frequencies in the range of 0 to 10° occupies a ratio of 60% or more of the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished surface of the tool body, measuring an inclination angle between the normal line to the polished surface and the normal line to (0001) plane as a crystal plane of the crystal grains, dividing the measured inclination angles belonging to a range of 0 to 45° every pitch of 0.25°, and counting the frequencies in each division;

the upper layer (c) is a Zr-containing $Al_2O_3$ layer, in which the insides of the crystal grains, which constitutes the upper layer (c) and occupies 60% or more as an area ratio in the crystal grains of the upper layer, are divided by at least one crystal lattice interface with the constituent atom-sharing lattice point type expressed by $\Sigma 3$, when electron beams are irradiated to the individual crystal grains in a measurement range of a polished surface of the tool body by utilizing a field-emission-type scanning electron microscope and an electron backscatter diffraction-imaging device to measure angles between normal lines of crystal lattice faces with hexagonal crystal lattices and the normal line to the surface of the tool body, a crystal orientation relationship between the adjacent crystal lattices is calculated based on the measurement result, and a distribution of lattice points (constituent atom-sharing lattice points) where each constituent atom of a crystal lattice interface shares one constituent atom between the crystal lattices is calculated, and when $\Sigma N+1$ represents a constituent atom-sharing lattice point type in which there are N lattice points sharing no constituent atoms between the constituent atom-sharing lattice points (here, N is an even number of 2 or higher in a crystal structure of a corundum-type hexagonal close-packing crystal, and N does not include 4, 8, 14, 24, and 26 when the upper limit of N is set to 28 in view of distribution frequency); and the Zr-containing $Al_2O_3$ layer has a structure made of crystal grains with a flat polygonal shape within a plane perpendicular to a layer thickness direction thereof when the structure of the upper layer (c) is observed by the field-emission-type scanning electron microscope.

It is known that chipping resistance is improved by the coated tool during high-speed intermittent cutting work.

SUMMARY OF INVENTION

Technical Problem

In recent years, the performance of a cutting apparatus has been remarkably enhanced, and there has been a strong demand for power saving and energy saving during cutting work and a further reduction in cost. In accordance with this, cutting work is performed at a higher speed and a high impact load tends to be applied intermittently to a cutting edge during intermittent heavy cutting with a large cutting depth and a high feed amount. In a case where the above-described conventional coated tool is used for continuous cutting or intermittent cutting of steel, cast iron or the like under typical conditions, there is no problem. However, in a case where the coated tool is particularly used under high-speed intermittent heavy cutting conditions, the adhesion between the lower layer including the Ti compound layer and the upper layer including the $Al_2O_3$ layer constituting the hard coating layer becomes insufficient. Therefore, the coated tool reaches the end of its service life within a relatively short period of time, due to the occurrence of undesirable damage such as peeling and chipping between the upper layer and the lower layer.

Solution to Problem

Therefore, from the above-described viewpoints, the inventors intensively studied to improve the adhesion between the lower layer including the Ti compound layer and the upper layer including the $Al_2O_3$ layer, and thereby preventing the occurrence of undesirable damage such as peeling and chipping and achieving an increase in the service life of the tool. As a result, the following knowledge was obtained.

In a coated tool coated with a lower layer including a Ti compound layer, an intermediate layer including an $Al_2O_3$ layer, and an upper layer including a Zr-containing $Al_2O_3$ layer, the adhesion between the lower layer and the intermediate layer can be improved by controlling the orientation of $Al_2O_3$ grains of the intermediate layer immediately on the outermost layer of the lower layer. In addition, the orientation of the upper layer including the Zr-containing $Al_2O_3$ layer coated on the intermediate layer can be controlled by controlling the orientation of $Al_2O_3$ grains of the intermediate layer. Furthermore, by controlling the orientation of $Al_2O_3$ grains of the intermediate layer, it is possible to increase the ratio of crystal lattice interfaces having many shared lattice points expressed as $\Sigma 3$ in $Al_2O_3$ grains of the upper layer. Therefore, it is possible to increase the number of atoms that constitute adjacent crystal grains and are shared at the grain boundary interface separating the crystal grains. Thereby, the high-temperature hardness and high-temperature strength of the hard coating layer can be maintained. In accordance with this, even in a case where the coated tool is used for high-speed intermittent heavy cutting in which a high impact load is applied intermittently to the cutting edge, it is possible to suppress the occurrence of undesirable damage such as peeling and chipping between the lower layer, the intermediate layer, and the upper layer. As a result, it was found that a coated tool exhibiting excellent cutting performance in long-term usage can be obtained.

In addition, it was found that further excellent chipping resistance can be exhibited by making the surface properties of $Al_2O_3$ grains of the surface of the upper layer to have a flat hexagonal structure.

Furthermore, by performing a wet blasting process on a flank face and a rake face including the cutting edge ridge portion on the surface of the upper layer, a desired residual stress can be imparted onto the polished surface of the flank face and the rake face. Thereby, it was found that chipping resistance can be further improved.

The present invention is made based on the above-described knowledge and provides a surface-coated cutting tool as follows.

(1) A surface-coated cutting tool, including:

a tool body made of tungsten carbide-based cemented carbide or titanium carbonitride-based cermet; and a hard coating layer which is vapor-deposited on a surface of the tool body, in which the hard coating layer includes:

(a) a lower layer which is a Ti compound layer including at least one of the group consisting of a Ti carbide layer, a Ti nitride layer, a Ti carbonitride layer, a Ti oxycarbide layer, and a Ti oxycarbonitride layer, and having an average total layer thickness of 3 to 20 µm;

(b) an intermediate layer which is an $Al_2O_3$ layer having an average layer thickness of 0.5 to 5 µm and having an α-crystal structure in a chemically vapor-deposited state; and (c) an upper layer which is a Zr-containing $Al_2O_3$ layer having an average layer thickness of 2 to 15 μm and having an α-crystal structure in a chemically vapor-deposited state, (d) an outermost layer of the lower layer is the Ti carbonitride layer having a layer thickness of 500 nm or more, where oxygen is contained only in a region having a depth of 500 nm or less from an interface between the Ti carbonitride layer and the intermediate layer in a layer thickness direction of the Ti carbonitride layer, and an average amount of oxygen contained in the region is 0.5 to 3 at % of a total amount of Ti, C, N, and O contained in the region, (e) in an inclination angle frequency distribution graph for $Al_2O_3$ grains of the intermediate layer, the highest peak exists in an inclination angle division in a range of 0 to 10° and the ratio of the sum of frequencies in the range of 0 to 10° is 50 to 70% to the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished cross-section of the intermediate layer, measuring inclination angles between the normal line to the surface of the tool body and the normal lines to (0001) planes as a crystal plane of the crystal grains in a range of 0 to 45°, dividing the measured inclination angles belonging to a range of 0 to 45° every pitch of 0.25°, and counting the frequencies in each division, (f) in an inclination angle frequency distribution graph for $Al_2O_3$ grains of the entirety of the intermediate layer and the upper layer, the highest peak exists in an inclination angle division in a range of 0 to 10° and ratio of the sum of frequencies in the range of 0 to 10° is 75% or more to the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished cross-section of the intermediate layer and upper layer, measuring inclination angles between the normal line to the surface of the tool body and the normal lines to (0001) planes as a crystal plane of the crystal grains in a range of 0 to 45°, dividing the measured inclination angles belonging to a range of 0 to 45° every pitch of 0.25°, and counting the frequencies in each division, and (g) regarding the $Al_2O_3$ grains of the intermediate layer and the upper layer, the insides of the crystal grains of which area ratio is 70% or more to the crystal grains constituting both of the intermediate layer and the upper layer, are divided by at least one crystal lattice interface with a constituent atom-sharing lattice point type expressed by Σ3, when electron beams are irradiated to the individual crystal grains in a measurement range of the polished cross-section of the intermediate layer and the upper layer by utilizing a field-emission-type scanning electron microscope and an electron backscatter diffraction-imaging device to measure angles between a normal line to each of crystal lattice faces of hexagonal crystal lattices and the normal line to the surface of the tool body, a crystal orientation relationship between the adjacent crystal lattices is calculated based on the measurement result, and a distribution of lattice points (constituent atom-sharing lattice points) where each of constituent atoms of a crystal lattice interface shares one constituent atom between the crystal lattices is calculated, and when ΣN+1 represents the constituent atom-sharing lattice point type in which there are N lattice points sharing no constituent atoms between the constituent atom-sharing lattice points (here, N is an even number of 2 or higher in a crystal structure of a corundum-type hexagonal close-packing crystal, and N does not include 4, 8, 14, 24, and 26 when the upper limit of N is set to 28 in view of distribution frequency).

(2) The surface-coated cutting tool described in (1), in which a value of X satisfies 0.0001≤X≤0.005 in terms of atomic ratio in a case where the Zr-containing $Al_2O_3$ layer constituting the upper layer is expressed as a composition formula of $(Al_{1-X}Zr_X)_2O_3$.

(3) The surface-coated cutting tool described in (1) or (2), in which an area ratio of crystal grains having a hexagonal shape in a plane perpendicular to the layer thickness direction is 50% or more to a region of which a structure is observed in the plane perpendicular to the layer thickness direction, when a structure of a surface of the Zr-containing $Al_2O_3$ layer constituting the upper layer is observed by the field-emission-type scanning electron microscope.

(4) The surface-coated cutting tool described in any one of (1) to (3), wherein a difference in tensile residual stresses between a flank face and a rake face is 100 MPa or lower, when any one of the rake face and the flank face including at least a cutting edge ridge portion in the Zr-containing $Al_2O_3$ layer constituting the upper layer is polished and residual stresses of the flank face and the rake face are measured.

Advantageous Effects of Invention

In the coated tool of the present invention, the TiCN layer containing a small amount of oxygen is formed as the outermost surface of the lower layer of the hard coating layer, and the α-$Al_2O_3$ layer including (0001) plane-oriented $Al_2O_3$ grains at a predetermined ratio is formed as the intermediate layer. Further, the Zr-containing α-$Al_2O_3$ layer is formed as the upper layer, the layer having (0001) plane-oriented $Al_2O_3$ grains at a predetermined ratio to the entirety of the intermediate layer and the upper layer and the crystal lattice interfaces with constituent atom-sharing lattice point type expressed as Σ3 at a predetermined ratio. Thereby, it is possible to control the orientation of $Al_2O_3$ grains of the intermediate layer immediately on the outermost layer of the lower layer and the orientation of Zr-containing $Al_2O_3$ grains of the upper layer, and to increase the adhesion strength between the lower layer, the intermediate layer, and the upper layer. Therefore, even in a case where cutting work of various types of steels, cast iron, or the like performed using the coated tool of the present invention under high-speed intermittent heavy cutting conditions in which a high impact load is applied intermittently to the cutting edge at a high speed, the coated tool of the present invention exhibits excellent high-temperature strength, high-temperature hardness, and excellent cutting performance in long-term usage without the occurrence of peeling and chipping of the hard coating layer.

BRIEF DESCRIPTION OF THE DRAWINGS

FIG. 1A shows a case where the inclination angle is 0°.

FIG. 1B shows a case where the inclination angle is 45°.

DETAILED DESCRIPTION OF THE INVENTION

Figure 1A:
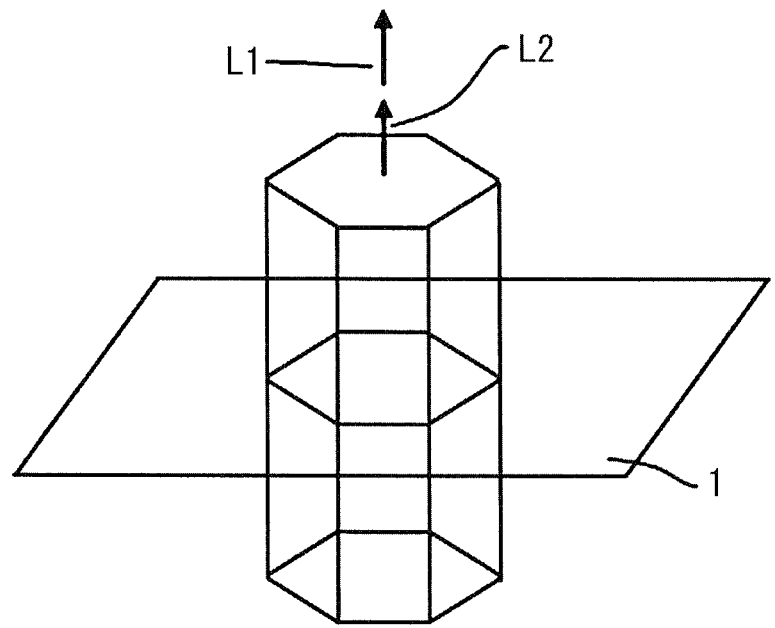
FIG. 1A is a schematic explanatory view showing a measurement range of the inclination angle between the normal line to a (0001) plane of a crystal grain of an α-$Al_2O_3$ layer and a Zr-containing α-$Al_2O_3$ layer constituting a hard coating layer and the normal line to the surface of a tool body.

Hereinafter, a coated tool according to an embodiment of the present invention will be described in detail with reference to the drawings. The coated tool according to this embodiment includes a tool body made of tungsten carbide-based cemented carbide or titanium carbonitride-based cermet, and a hard coating layer formed on the surface of the tool body. The hard coating layer includes the following layers.

(a) Ti Compound Layer (Lower Layer)

A Ti compound layer (for example, a TiC layer, a TiN layer, a TiCN layer, a TiCO layer, and a TiCNO layer) is basically present as a lower layer of an $Al_2O_3$ layer. Since a Ti compound has excellent high-temperature strength, the hard coating layer having the Ti compound has high-temperature strength. In addition, since the Ti compound layer adheres to both of the tool body and the $Al_2O_3$ layer, it is possible to maintain the adhesion of the hard coating layer to the tool body. The Ti compound layer includes one or more layers and has an average total layer thickness of 3 to 20 μm. When the average total layer thickness of the Ti compound layer is smaller than 3 μm, the above-described actions cannot be sufficiently exhibited. On the other hand, when the average total layer thickness thereof is greater than 20 μm, thermoplastic deformation is likely to occur and as a result, uneven wear occurs, particularly during high-speed heavy cutting and high-speed intermittent cutting accompanied by the generation of high-temperature heat. Therefore, the average total layer thickness of the Ti compound layer is determined as 3 to 20 μm.

(b) Outermost Layer of Lower Layer

In the lower layer 2 of the coated tool of this embodiment, an outermost layer which shares an interface with an intermediate layer 3, described later, is formed, for example, in the following manner.

First, various Ti compound layers including one or more layers of a TiC layer, a TiN layer, a TiCN layer, a TiCO layer, and a TiCNO layer are vapor-deposited using a typical chemical deposition device. The typical chemical deposition device means a chemical deposition device that is generally used for forming coatings of tools, includes a furnace heater and a reaction chamber, and is used for chemical deposition in such a manner that a tool body is disposed in the reaction chamber and a coating layer is formed on the tool body by a chemical reaction of gases supplied into the chamber. In addition, by omitting this process, only the TiCN layer which becomes the outermost layer of the lower layer 2 of this embodiment may be vapor-deposited.

Thereafter, chemical deposition is performed using the same typical chemical deposition device under the following conditions.

Reaction gas composition (volume %): 2.5 to 10% of $TiCl_4$, 0.5 to 2.0% of $CH_3CN$, 40 to 60% of $N_2$, and the balance of $H_2$ Reaction atmosphere temperature: 800 to 900° C.

Reaction atmosphere pressure: 6 to 10 kPa

As described above, as the outermost layer of the lower layer 2, for example, a TiCN layer containing oxygen (hereinafter, oxygen-containing TiCN) is formed.

When the TiCN layer is formed as the outermost layer, chemical deposition is performed with a gas in which CO gas is added to the reaction gas in 1 to 5 volume % with respect to the total amount of reaction gas for last 5 to 30 minutes of a deposition time necessary for obtaining a predetermined layer thickness. Accordingly, an oxygen-containing TiCN layer is vapor-deposited. The layer contains 0.5 to 3 at % of oxygen only in the surface of the outermost layer, that is, in a region with a depth of 500 nm or less from the interface between the outermost layer and the intermediate layer 3, in the layer thickness direction (a direction perpendicular to the surface of the tool body and toward the surface of the tool body).

In order to form the intermediate layer 3 having preferable $Al_2O_3$ grains on the outermost layer of the lower layer 2 including the oxygen-containing TiCN layer, the outermost layer of the lower layer 2 is formed to have a thickness of at least 500 nm or greater. In addition, the oxygen-containing TiCN layer contains 0.5 to 3 at % of oxygen only in a region with a depth of 500 nm or less from the interface between the oxygen-containing TiCN layer and the intermediate layer 3 in the layer thickness direction of the oxygen-containing TiCN layer and does not contain oxygen in a region with a depth of greater than 500 nm. Accordingly, the intermediate layer 3 with desired orientation can be formed on the outermost layer. The outermost layer of the lower layer 2 is allowed to contain less than 0.5 at % of oxygen as unavoidable impurities. Therefore, "does not contain oxygen" strictly means that an oxygen content is less than 0.5 at %.

Here, the reason for limiting the average oxygen content of the oxygen-containing TiCN layer in the region with a depth of 500 nm or less as described above will be described. When 0.5 at % or more of oxygen is contained in a region with a depth of greater than 500 nm from the interface between the oxygen-containing TiCN layer and the intermediate layer 3 in the layer thickness direction, the structure of the outermost layer, which is the TiCN layer, is transformed from a columnar structure into a granular structure, and $Al_2O_3$ grains of the intermediate layer 3 with desired orientation cannot be formed immediately on the outermost layer of the lower layer 2.

When the average oxygen content in the region with a depth of 500 nm or less is less than 0.5 at %, it is not possible to expect the increase in the adhesion strength between $Al_2O_3$ of the intermediate layer 3 and TiCN of the lower layer 2. In addition, desired orientation cannot be imparted to $Al_2O_3$ grains immediately on the outermost layer of the lower layer 2. On the other hand, when the average oxygen content of the region is more than 3 at %, the sum of frequencies in a range of 0 to 10° becomes less than 50% of the total number of frequencies in an inclination angle frequency distribution graph, in a case where an inclination angle between the normal lines to the (0001) plane as a crystal plane of a crystal grain and the normal line to the surface of the tool body is measured for $Al_2O_3$ of the intermediate layer 3 immediately on the interface in a range of 0 to 45°, and the inclination angle frequency distribution graph is plotted in a range of 0 to 45° among the measured inclination angles described later. Therefore, the high-temperature strength of the intermediate layer 3 and an upper layer 4 formed thereon decreases.

Here, the average oxygen content is an oxygen (O) content in terms of atomic % ($=O/(Ti+C+N+O)\times 100$) with respect to the total amount of titanium (Ti), carbon (C), nitrogen (N), and oxygen (O) in the region with a depth of 500 nm or less from the interface between the TiCN layer constituting the outermost layer of the lower layer 2 and the intermediate layer 3 in the layer thickness direction of the TiCN layer.

(c) $\alpha$-$Al_2O_3$ Layer of Intermediate Layer

An oxidation process is performed on the surface of the oxygen-containing TiCN layer (the outermost layer) which is formed in accordance with above-described (b) and contains 0.5 to 3 at % of oxygen using a mixed gas of CO and $CO_2$, for example, under the following conditions.

Reaction gas composition (volume %): 5 to 10% of CO, 5 to 10% of $CO_2$, and the balance of $H_2$
Atmosphere temperature: 980 to 1040° C.
Atmosphere pressure: 5 to 15 kPa
Time: 2 to 5 min Accordingly, nuclei of Al compound, which is necessary for the nucleation of $\alpha$-$Al_2O_3$ of the intermediate layer 3, can be uniformly dispersed on the outermost surface of the Ti compound layer. As a result, in a process before the nucleation of $Al_2O_3$, $\alpha$-$Al_2O_3$ nuclei can be uniformly dispersed on the outermost surface of the Ti compound layer.

Next, $Al_2O_3$ is vapor-deposited, for example, under the following conditions.

Reaction gas composition (volume %): 1 to 3% of $AlCl_3$, 1 to 5% of $CO_2$, and the balance of $H_2$
Reaction atmosphere temperature: 980 to 1040° C.
Reaction atmosphere pressure: 5 to 15 kPa
Time: 5 to 30 min Next, $Al_2O_3$ is vapor-deposited under the following conditions.

Reaction gas composition (volume %): 1 to 3% of $AlCl_3$, 3 to 10% of $CO_2$, 1 to 5% of HCl, 0.25 to 1.0% of $H_2S$, and the balance of $H_2$
Reaction atmosphere temperature: 980 to 1040° C.
Reaction atmosphere pressure: 5 to 15 kPa
Time: 30 to 120 min Thereby, the intermediate layer 3 according to this embodiment is vapor-deposited.

Figure 1B:
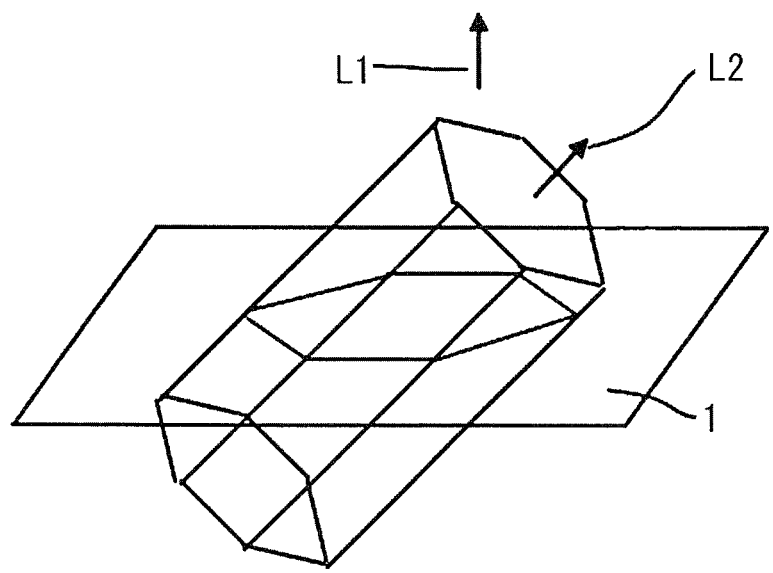
FIG. 1B is a schematic explanatory view showing a measurement range of the inclination angle between the normal line to a (0001) plane of a crystal grain of an α-$Al_2O_3$ layer and a Zr-containing α-$Al_2O_3$ layer constituting a hard coating layer and the normal line to the surface of a tool body.
Figure 2:
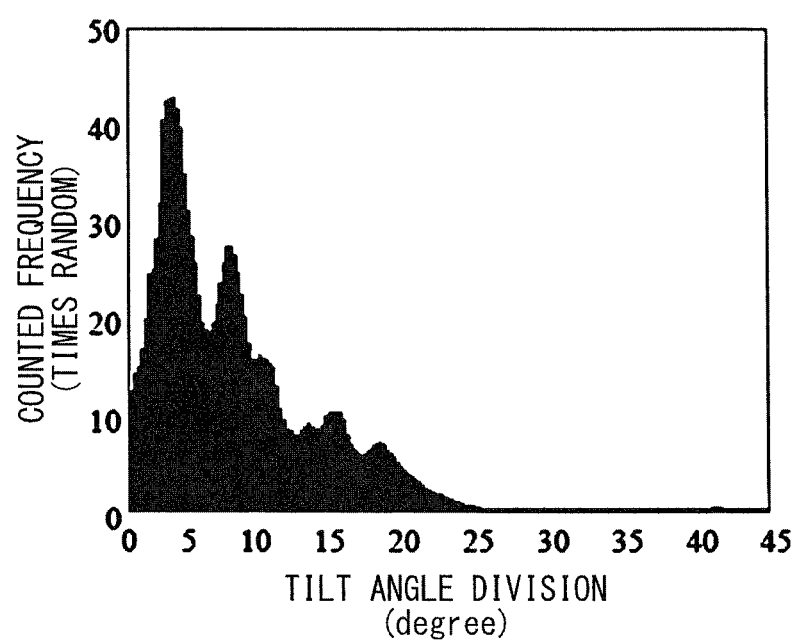
FIG. 2 is an inclination angle frequency distribution graph of the (0001) planes of the α-$Al_2O_3$ layer constituting an intermediate layer of the hard coating layer of the invention coated tool 1.

Next, a method for evaluating the orientation of $Al_2O_3$ grains of the intermediate layer 3 of (c) described above will be described. Using a field-emission-type scanning electron microscope, an electron beam is irradiated to each of the crystal grains with a hexagonal crystal lattice in a measurement range of a polished cross-section of the intermediate layer 3, and inclination angles between a normal line L1 to a surface 1 of the tool body and normal lines L2 to a (0001) planes as a crystal plane of the crystal grain are measured. Here, the polished cross-section is a surface obtained by cutting the hard coating layer in a plane perpendicular to the tool body and polishing the cut surface. In addition, the measurement range of the inclination angle measured in this embodiment (hereinafter, also referred to as a measured inclination angle) is a range of from 0° of FIG. 1A to 45° of FIG. 1B. In a case where the range of from 0 to 45° among the measured inclination angles is divided by a pitch of 0.25° and frequencies in each division are counted and plotted to form an inclination angle frequency distribution graph, the inclination angle frequency distribution graph is shown as FIG. 2. According to the intermediate layer 3 of this embodiment, as shown in FIG. 2, a sharp highest peak is shown at a specific position of the inclination angle divisions, that is, in a range of 0 to 10°. According to the vapor-deposition method of the intermediate layer 3 described above, when the reaction atmosphere pressure in the chemical deposition device is set to a range of 5 to 15 kPa as described above, the highest peak is in a range of 0 to 10° in the inclination angle divisions and the sum of frequencies in the range of 0 to 10° is 50 to 70% of the total frequencies in the inclination angle frequency distribution graph. Thus, a large number of crystal grains in which the normal line to the (0001) plane is oriented in the vicinity of the normal line of the surface 1 of the tool body exist in the intermediate layer (the degree of the (0001) plane orientation is high). $\alpha$-$Al_2O_3$ of the intermediate layer 3 with the highest peak of counted frequencies in the range of 0 to 10° of the inclination angle divisions in the inclination angle frequency distribution graph, has further excellent high-temperature strength, in addition to excellent high-temperature hardness and heat resistance provided by an $\alpha$-$Al_2O_3$ layer that is hitherto known. Furthermore, since the intermediate layer 3 is formed as the $\alpha$-$Al_2O_3$ layer with a high degree of the (0001) plane orientation, it is possible to increase the degree of the (0001) plane orientation of the upper layer 4 (Zr-containing $Al_2O_3$ layer) vapor-deposited on the intermediate layer 3. As a result, it is possible to improve the surface properties of the upper layer 4 and to further enhance high-temperature strength thereof. In a case where the ratio of the sum of frequencies in the range of 0 to 10° is lower than 50%, it is not possible to increase the degree of the (0001) plane orientation in the $Al_2O_3$ layer of the intermediate layer 3 and the Zr-containing $Al_2O_3$ layer of the upper layer 4 described later, and to obtain desired high-temperature strength and high-temperature hardness. In a case where the ratio is more than 70%, the adhesion between the lower layer 2 and the intermediate layer 3 is reduced, and it is difficult to obtain desired peeling resistance and chipping resistance. Therefore, in the intermediate layer 3 of this embodiment, the ratio is 50 to 70%.

The average layer thickness of the intermediate layer 3 is 0.5 to 5 µm. When the average layer thickness of the intermediate layer 3 is smaller than 0.5 µm, the above-described characteristics of the intermediate layer 3 cannot be sufficiently imparted to the hard coating layer. On the other hand, when the average layer thickness of the intermediate layer 3 is greater than 5 µm, due to high-temperature heat generated during high-speed heavy cutting or high-speed intermittent cutting and a high impact load applied intermittently to the cutting edge, thermoplastic deformation causing uneven wear easily occurs, thereby accelerating wear. Therefore, the average layer thickness of the intermediate layer 3 is determined to be 0.5 to 5 µm.

(d) Zr-containing α-$Al_2O_3$ Layer of Upper Layer

In the upper layer 4 including the Zr-containing α-$Al_2O_3$ layer that is chemically vapor-deposited on the intermediate layer 3, an Al component constituting the layer improves the high-temperature hardness and heat resistance of the layer. In addition, Zr is contained in the layer in a such a manner that a ratio (Zr/(Al+Zr)) of Zr to the total amount of Zr and Al is 0.0001 to 0.005 (in terms of atomic ratio). That is, in a case where the Zr-containing $Al_2O_3$ layer of the upper layer 4 is expressed by a composition formula of $(Al_{1-X}Zr_X)_2O_3$, the value of X is $0.0001 \leq X \leq 0.005$ in terms of atomic ratio. The Zr component contained in the upper layer 4 in a small proportion improves the grain boundary interface strength of the Zr-containing α-$Al_2O_3$ layer and contributes to the improvement of high-temperature strength. When the content ratio of the Zr component is less than 0.0001, the above-described actions cannot be expected. On the other hand, in a case where the content ratio of the Zr component exceeds 0.005, the grain interface strength is reduced due to the precipitation of $ZrO_2$ particles in the layer or the like. Therefore, it is preferable that the content ratio (the value of the ratio Zr/(Al+Zr)) of Zr to the total amount of the Zr component and the Al component be 0.0001 to 0.005 (in terms of atomic ratio).

The Zr-containing α-$Al_2O_3$ layer can be vapor-deposited by adjusting each of chemical deposition conditions including a reaction gas composition, a reaction atmosphere temperature, and a reaction atmosphere pressure during deposition, for example, as follows.

First, a first stage of vapor-deposition is performed for about one hour under the following conditions.

Reaction gas composition (volume %): 1 to 5% of $AlCl_3$, 0.03 to 0.15% of $ZrCl_4$, 3 to 6% of $CO_2$, 1 to 5% of HCl, 0.12 to 0.5% of $H_2S$, and the balance of $H_2$ Reaction atmosphere temperature: 900 to 980° C.

Reaction atmosphere pressure: 5 to 15 kPa

Next, a second stage of vapor-deposition is performed under the following conditions.

Reaction gas composition (volume %): 1 to 5% of $AlCl_3$, 0.3 to 1.2% of $ZrCl_4$, 3 to 8% of $CO_2$, 1 to 5% of HCl, 0.12 to 0.5% of $H_2S$, and the balance of $H_2$ Reaction atmosphere temperature: 900 to 980° C.

Reaction atmosphere pressure: 5 to 15 kPa

By performing vapor-deposition under such conditions, a vapor-deposition film with an average layer thickness of 2 to 15 µm is formed. As a result, it is possible to form the Zr-containing α-$Al_2O_3$ layer in which the value of the ratio Zr/(Al+Zr) is 0.0001 to 0.005 in terms of atomic ratio.

Figure 3A:
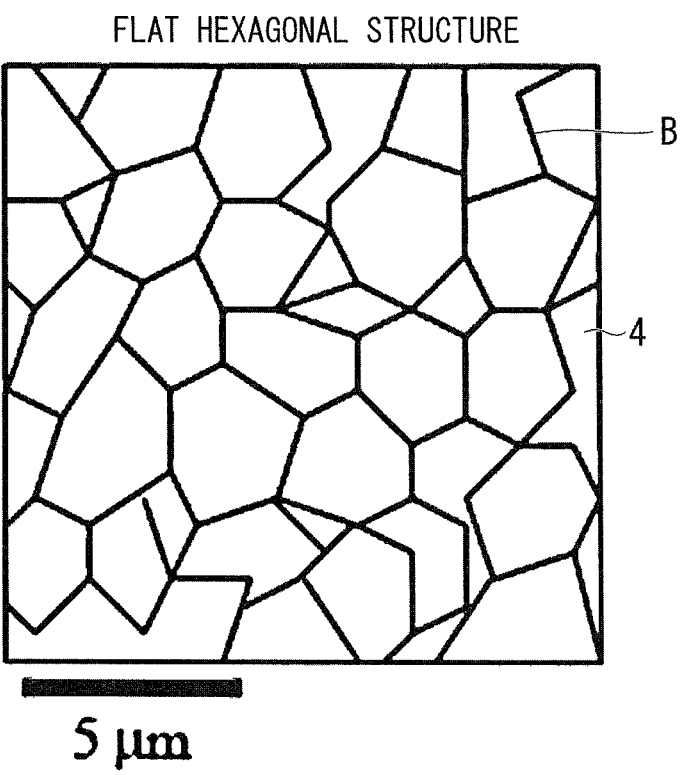
FIG. 3A is a schematic view showing a crystal grain structure having a flat polygonal shape, which is obtained by observing an upper layer including a Zr-containing α-$Al_2O_3$ layer of the invention coated tool 1 using a field-emission-type scanning electron microscope in a plane perpendicular to the layer thickness direction.
Figure 3B:
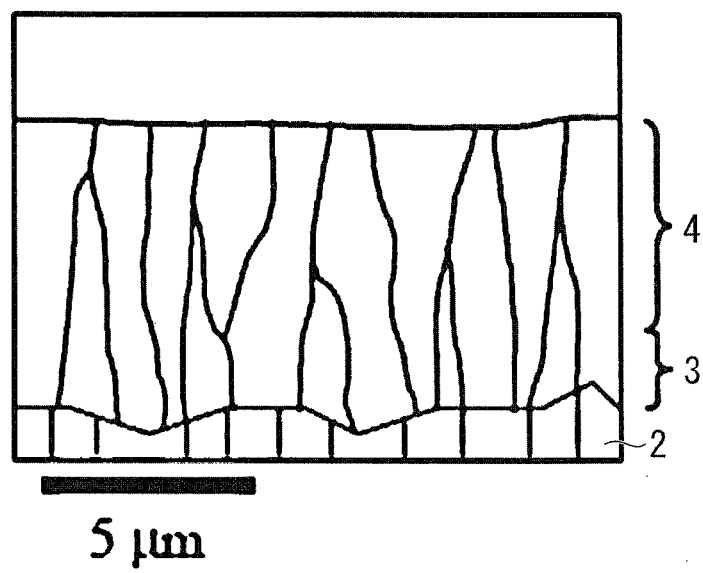
FIG. 3B is a schematic view showing a grain structure having a substantially flat layer surface and a vertically long shape along the layer thickness direction, which is obtained by observing the upper layer including the Zr-containing α-$Al_2O_3$ layer of the invention coated tool 1 using the field-emission-type scanning electron microscope in a plane parallel to the layer thickness direction.

FIGS. 3A and 3B illustrate images of the structure of the Zr-containing α-$Al_2O_3$ layer observed by the field-emission-type scanning electron microscope. As shown in FIG. 3A, when viewed in a plane perpendicular to the layer thickness direction, the Zr-containing α-$Al_2O_3$ layer has a crystal form with a flat polygonal shape, specifically, hexagonal shape. In addition, as shown in FIG. 3B, when viewed in a plane parallel to the layer thickness direction, the Zr-containing α-$Al_2O_3$ layer has the surface which is substantially flat and has crystal form including crystal grains with a vertically long shape in the layer thickness direction. That is, in the upper layer 4, a structure formed of crystal grains having a flat polygonal shape and a vertically long shape is formed.

With respect to the entirety of the α-$Al_2O_3$ layer constituting the intermediate layer 3 and the Zr-containing α-$Al_2O_3$ layer constituting the upper layer 4, the highest peak of the counted frequencies exists in a range of 0 to 10° of the inclination angle divisions in an inclination angle frequency distribution graph obtained by measuring inclination angles between the normal line L1 of the surface 1 of the tool body and the normal lines L2 of the (0001) planes in the same manner as that of the intermediate layer 3 of (c) described above. In addition, in the inclination angle frequency distribution graph, a ratio of the sum of frequencies in the range of 0 to 10° is 75% or more to the total frequencies in the inclination angle frequency distribution graph. As described above, the degree of the (0001) plane orientation of the Zr-containing α-$Al_2O_3$ layer constituting the upper layer 4 is higher than that of the intermediate layer 3.

That is, the α-$Al_2O_3$ layer as the intermediate layer 3 is formed so that the sum of frequencies in the range of 0 to 10° in the inclination angle frequency distribution graph thereof is 50 to 70% of the total frequencies in the inclination angle frequency distribution graph. Therefore, the Zr-containing α-$Al_2O_3$ layer is also formed as a layer with a high degree of the (0001) plane orientation (in the inclination angle frequency distribution graph for the entirety of the intermediate layer 3 and the upper layer 4, the sum of frequencies in the range of 0 to 10° is 75% or more to the total frequencies in the inclination angle frequency distribution graph).

In addition, when the upper layer 4 is viewed in the plane parallel to the layer thickness direction, the surface of the layer is substantially flat and exhibits excellent surface properties. As a result, the upper layer 4 exhibits further excellent chipping resistance.

In addition, in the vapor-deposition of the Zr-containing α-$Al_2O_3$ layer of the upper layer 3, when the vapor-deposition is performed under more restricted conditions (for example, conditions in which 0.15 to 0.25 volume % of $H_2S$ is contained in the reaction gas and the reaction atmosphere temperature is set to 960 to 980° C. in the first stage, and 0.6 to 0.9 volume % of $ZrC_4$ and 0.15 to 0.25 volume % of $H_2S$ is contained in the reaction gas and the reaction atmosphere temperature is set to 960 to 980° C. in the second stage), the following structure is formed. That is, a structure is formed where crystal grains having a crystal form of a flat hexagonal shape when a plane perpendicular to the layer thickness direction is viewed as shown in FIG. 3A, having a substantially flat surface of layer when a plane parallel to the layer thickness direction is viewed as shown in FIG. 3B, and having a vertically long shape along the layer thickness direction occupy an area of 50% or more of the entire area in the plane perpendicular to the layer thickness direction. Here, in this embodiment, a "flat" surface means that a polygonal pyramid having a polygon as the basal plane with the grain boundary B of FIG. 3A as its side is not formed on the surface of the vapor-deposited layer as shown in FIGS. 3A and 3B. More specifically, it means that the apex of a polygonal pyramid in FIG. 3A is not formed in the vicinity of the intersection of the diagonals of a polygon.

Furthermore, in the $Al_2O_3$ grains of the entirety of the intermediate layer 3 and the Zr-containing α-$Al_2O_3$ layer, crystal lattice interfaces B3 expressed as Σ3 exist in crystal grains having an area ratio of 70% or more. This evaluation method will be described.

Figure 4:
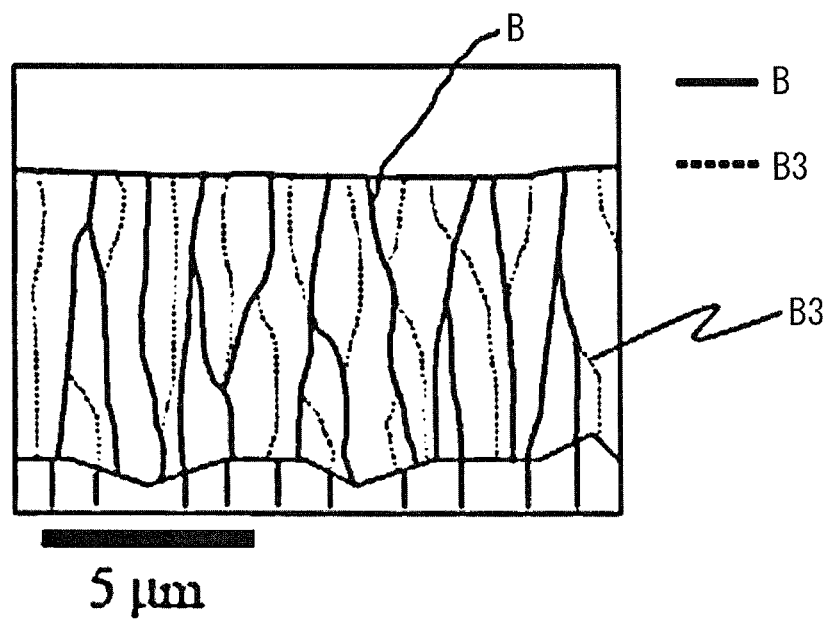
FIG. 4 is an grain boundary analysis view of the $Al_2O_3$ layer of the intermediate layer and the Zr-containing α-$Al_2O_3$ layer of the upper layer in the invention coated tool 1, which is measured by the field-emission-type scanning electron microscope and an electron backscatter diffraction-imaging device in the plane parallel to the layer thickness direction. Solid lines indicate grain boundaries observed by the field-emission-type scanning electron microscope, and broken lines indicate Σ3 coincidence site lattice interface measured by the electron backscatter diffraction-imaging device.

First, an electron beam is irradiated toward each of the crystal grains in a measurement range of a polished cross-section of the intermediate layer 3 and the upper layer 4 by the field-emission-type scanning electron microscope and an electron backscatter diffraction-imaging device, and an angle between each of the normal lines to crystal lattice planes formed by hexagonal crystal lattices and the normal line L1 of the polished surface (a surface parallel to the surface 1 of the tool body) is measured. Based on the measurement results, the relationship between the crystal orientations of adjacent crystal lattices is calculated. Then, the distribution of lattice points (constituent atom-sharing lattice points) at which constituent atoms forming the crystal lattice interface share a single constituent atom between the crystal lattices, is calculated based on the calculated relationship between the crystal orientations. In addition, a distribution state of the crystal lattice interfaces B3 with the constituent atom-sharing lattice point type expressed as Σ3, is obtained based on the calculated distribution of the constituent atom-sharing lattice points, when constituent atom-sharing lattice point type in which there are N lattice points sharing no constituent atoms between the constituent atom-sharing lattice points, is expressed as ΣN+1 (here, N is an even number of 2 or higher in a crystal structure of a corundum-type hexagonal close-packing crystal, and 4, 8, 14, 24, and 26 do not exist from the view point of a distribution frequency in a case where the upper limit of N is 28). As shown in FIG. 4, in a cross-section parallel to the layer thickness direction, among the crystal grains having a flat polygonal and a vertically long shape and constituting the $Al_2O_3$ layer of the intermediate layer 3 and the upper layer 4, the insides of the crystal grains having an area ratio or 70% or more are separated by one or more crystal lattice interfaces with the constituent atom-sharing lattice point type expressed as Σ3.

In a modified $(Al,Zr)_2O_3$ layer of a coating structure in the related art (Japanese Unexamined Patent Application, First Publication No. 2009-279694), it is shown that Σ3 coincidence site lattice interfaces are present in a proportion of 60% or more. Contrary to this, in this embodiment, since the Σ3 coincidence site lattice interfaces are present at an area ratio of 70% or more even in the α-$Al_2O_3$ layer of the intermediate layer 3, the Σ3 coincidence site lattice interfaces are uniformly distributed along the layer thickness direction from the intermediate layer 3 to the upper layer 4. As a result, the grain boundary density of the entire $Al_2O_3$ layer of the intermediate layer 3 and the upper layer 4 increases, and thus the chipping resistance and fracturing resistance can be improved.

In addition, the crystal lattice interfaces B3 with the constituent atom-sharing lattice point type expressed as Σ3 described above, are present insides of the crystal grains having a flat polygonal shape (including a hexagonal shape) and a vertically long shape of the Zr-containing α-$Al_2O_3$ layer. Therefore, the strength inside the crystal grains can be increased. As a result, during high-speed intermittent heavy cutting work of high-strength steel in which a high load is applied, the occurrence of cracking in the Zr-containing α-$Al_2O_3$ layer can be suppressed. Even when cracks occur, since the growth and propagation of cracks can be prevented, chipping resistance, fracturing resistance, and peeling resistance can be improved.

As described above, the upper layer 4 of this embodiment includes the Zr-containing α-$Al_2O_3$ layer having the crystal lattice interfaces B3 with the constituent atom-sharing lattice point type expressed as Σ3 existing inside the crystal grains thereof which has a high degree of the (0001) plane orientation, surface properties with flat surface, a flat polygonal shape (including a flat hexagonal shape), and a vertically long shape. Therefore, even during high-speed intermittent heavy cutting work of high-strength steel in which high-temperature heat is generated and a high impact load is applied intermittently to a cutting edge, the upper layer 4 of this embodiment exhibits excellent chipping resistance and wear resistance over a long period of time without the occurrence of chipping, fracturing, peeling, thermoplastic deformation, uneven wear, and the like.

The average layer thickness of the upper layer 4 including the Zr-containing α-$Al_2O_3$ layer described above is 2 to 15 μm. When the average layer thickness of the upper layer 4 is smaller than 2 μm, the excellent characteristics of the upper layer 4 cannot be sufficiently exhibited. On the other hand, when the average layer thickness of the upper layer 4 is greater than 15 μm, thermoplastic deformation, which is a cause of uneven wear, easily occurs, and chipping also easily occurs. Therefore, the average layer thickness of the upper layer 4 is determined as 2 to 15 μm.

In addition, regarding the coated tool of this embodiment, after forming the Zr-containing α-$Al_2O_3$ layer of the upper layer 4, the surface thereof is subjected to a polishing process through wet blasting in which a polishing liquid containing, for example, $Al_2O_3$ fine particles at a ratio of 15 to 60 mass % to the total amount of water and the particles as a jet abrasive is sprayed. Thereby, the surface roughness of the Zr-containing α-$Al_2O_3$ layer can be adjusted to Ra=0.02 to 0.3 μm. In addition, by performing such a polishing process, for example, the difference in the tensile residual stress value between a flank face and a rake face can be 100 MPa or lower. Here, the flank face and the rake face are faces forming the cutting edge in the coated tool, and the cutting edge is formed on the ridge portion (cutting edge ridge portion) where the flank face intersects with the rake face. As in this embodiment, by performing the above-described polishing process on the surface of the Zr-containing α-$Al_2O_3$ layer as the upper layer 4 and the α-$Al_2O_3$ layer as the intermediate layer 3 with a high degree of the (0001) plane orientation formed on the oxygen-containing TiCN layer containing oxygen which is vapor-deposited on the outermost surface of the Ti compound layer as the lower layer 2, the tensile strength difference of the cutting edge ridge portion where the flank face intersects with the rake face is reduced. Therefore, chipping, which is undesirable, can be suppressed. On the other hand, when the difference in the tensile residual stress value is greater than 100 MPa, the tensile strength difference of the ridge portion is increased, and thus cracks on the surface of the coating, or chipping or peeling initiated due to cracks may easily occur. Therefore, desired peeling resistance or chipping resistance cannot be obtained.

The "surface roughness Ra" mentioned here refers to a value of an arithmetic mean roughness Ra specified in JIS B 0601:1994 (corresponding to ISO 4287:1997), and the measurement method thereof is not particularly limited.

Next, Examples of the coated tool of the invention will be described in detail.

EXAMPLES

As the raw material powders, a WC powder, a TiC powder, a ZrC powder, a TaC powder, a NbC powder, a $Cr_3C_2$ powder, a TiN powder, a TaN powder, and a Co powder, all of which have an average grain size of 2 to 4 μm, were prepared. The raw material powders were mixed so as to be in the compositions shown in Table 1. Wax was further added thereto. The mixture was blended in acetone by a ball mill for 24 hours and then was dried under reduced pressure. Thereafter, the resultant was press-formed into compacts with predetermined shapes at a pressure of 98 MPa. The compacts were held in a vacuum at 5 Pa and a predetermined temperature in a range of 1370 to 1470° C. for one hour to be sintered. After the sintering, a cutting edge portion was subjected to honing to have a radius R of 0.07 mm, thereby forming tool bodies A to E made of WC-based cemented carbide with insert shapes specified in ISO standard CNMG 120412.

In addition, as the raw material powders, a TiCN (TiC/TiN=50/50 in terms of mass ratio) powder, a $Mo_2C$ powder, a ZrC powder, a NbC powder, a TaC powder, a WC powder, a Co powder, and a Ni powder, all of which have an average grain size of 0.5 to 2 μm, were prepared. The raw material powders were mixed so as to be in the compositions shown in Table 2. The mixture was subjected to wet blending by a ball mill for 24 hours, and was dried. Thereafter, the resultant was press-formed into compacts at a pressure of 98 MPa. The compacts were held in a nitrogen atmosphere at 1.3 Pa at a temperature of 1540° C. for one hour to be sintered. After the sintering, a cutting edge portion was subjected to honing to have a radius R of 0.07 mm, thereby forming tool bodies a to e made of TiCN-based cermet with insert shapes specified in ISO standard CNMG 120412.

Next, each of the tool bodies A to E and the tool bodies a to e was mount onto a typical chemical deposition device. Then, a hard coating layer was vapor-deposited thereon in the following manner, thereby producing each of invention coated tools 1 to 13 shown in Table 9.

(a) First, under conditions shown in Table 3 (1-$TiC_{0.5}N_{0.5}$ in Table 3 represents forming conditions of a TiCN layer with a longitudinally growth crystal structure described in Japanese Unexamined Patent Application, First Publication No. H06-8010, and the others represent forming conditions of granular crystal structure), a Ti compound layer shown in Table 8 was vapor-deposited as a lower layer of the hard coating layer until a target layer thickness of Table 8 was achieved. Here, a "first layer" in Table 3 and Table 8 represents a layer that was directly formed on the tool body.

(b) Secondly, under conditions shown in Table 4, an oxygen-containing TiCN layer as the outermost layer of the lower layer (that is, a layer containing 0.5 to 3 at % (O/(Ti+C+N+O)×100) of oxygen only in a region with a depth of 500 nm or less from the surface thereof) was formed into a target layer thickness shown in Table 8.

(c) Next, the surface of the Ti compound layer subjected to the process of (b) described above was subjected to an oxidation process using a mixed gas of CO and $CO_2$ under conditions shown in Table 5.

(d) Then, under conditions shown in Table 6, an α-$Al_2O_3$ layer with a target layer thickness shown in Table 9 was formed as an intermediate layer of the hard coating layer through two stages of vapor-deposition. Specifically, vapor-deposition was performed until the layer thickness reached 0.3 to 3% of the target layer thickness shown in Table 9 under conditions of a first stage of Table 6, and then vapor-deposition was performed until the layer thickness of the entirety of the intermediate layer reached the target layer thickness shown in Table 9 under conditions of a second stage of Table 6.

(e) Next, under deposition conditions shown in Table 7, a Zr-containing $Al_2O_3$ layer with a target layer thickness shown in Table 9 was formed as an upper layer of the hard coating layer through two stages of vapor-deposition. Specifically, vapor-deposition was performed until the layer thickness reached 0.3 to 3% of the target layer thickness shown in Table 9 under conditions of a first stage of Table 7, and then vapor-deposition was performed until the layer thickness of the entirety of the upper layer reached the target layer thickness shown in Table 9 under conditions of a second stage of Table 7.

In Tables 4 to 6, conditions in which the hard coating layer of the coated tool according to this embodiment could not be formed were indicated by "outside of the present invention".

For the purpose of comparison, each of the tool bodies A to E and the tool bodies a to e was mounted onto a typical chemical deposition device. Then, a hard coating layer was vapor-deposited thereon in the following manner, thereby producing comparative coated tools 1 to 13 shown in Table 11.

First, under conditions shown in Table 3 and conditions shown in Table 4, a Ti compound layer with a target layer thickness shown in Table 8 was vapor-deposited.

Next, under conditions shown in Table 4, oxygen was contained therein under conditions (in Table 4, indicated as outside of the present invention) that deviate from the above-described process (b) of the invention coated tools 1 to 13. In addition, similarly, under conditions (in Table 5, indicated as conditions outside of the present invention) that deviate from (c), an oxidation process was performed using a mixed gas of CO and $CO_2$. In addition, under conditions (in Table 11, indicated by outside of the present invention) that deviate from (d), an $Al_2O_3$ layer was formed. In addition, under conditions (in Table 7, indicated as conditions outside of the present invention) that deviate from (e), a Zr-containing $Al_2O_3$ layer was formed.

In addition, a wet blasting process as a polishing process was performed on the surfaces of the Zr-containing $Al_2O_3$ layers of the invention coated tools 1 to 3, 5, 7, 8, 10, 11, and 13 and the Zr-containing $Al_2O_3$ layers of the comparative coated tools 1 to 3, 5, 7, 8, 10, 11, and 13 at a blasting pressure of 0.13 MPa using 200-mesh $Al_2O_3$ particles.

In Tables 9 and 11, the value of the difference in the tensile residual stress value between a flank face and a rake face of each of the Zr-containing $Al_2O_3$ layers of the invention coated tools and the Zr-containing $Al_2O_3$ layers of the comparative coated tools subjected to the polishing process, is shown.

The residual stress was measured as follows.

A measurement sample was inserted into an X-ray analyzer, and X-rays which use Cu (a wavelength of 0.1541 nm) as an X-ray source were irradiated toward a surface (a flank face or a rake face) of the tool body to be measured. As a crystal plane of $Al_2O_3$ to be measured, a (13-4,10) plane was selected, and stress measurement was performed by a $\sin^2 \phi$ method.

Regarding the invention coated tools 1 to 13 and the comparative coated tools 1 to 13, in order to obtain the oxygen content intentionally added to a Ti carbonitride layer as the outermost layer of the lower layer, a TiCN (hereinafter, referred to as unavoidable oxygen-containing TiCN) layer which did not intentionally contain oxygen was formed into a layer thickness of 3 μm or greater on the surface of the tool body made of tungsten carbide-based cemented carbide or titanium carbonitride-based cermet by performing chemical vapor-deposition under the following conditions:

Reaction gas composition (volume %): 2.5 to 10% of TiCl$_4$, 0.5 to 2.0% of CH$_3$CN, 40 to 60% of N$_2$, and the balance of H$_2$ Reaction atmosphere temperature: 800 C to 900° C.
Reaction atmosphere pressure: 6 to 10 kPa The oxygen content that was unavoidably contained in a region with a depth of greater than 100 nm from the surface of the unavoidable oxygen-containing TiCN layer in the layer thickness direction thereof, was obtained from the ratio of oxygen to the total amount of Ti, C, N, and O contained in the region with the depth by an Auger electron spectroscopy analyzer. Then, the unavoidable oxygen content obtained in a range with the precision of the Auger electron spectroscopy analyzer was determined as 0.5 at %.

Next, regarding the invention coated tools 1 to 13 and the comparative coated tools 1 to 13, in the TiCN layer as the outermost surface of the lower layer, the average oxygen content (=O/(Ti+C+N+O)×100) in a region with a depth of 500 nm or less in the layer thickness direction of the TiCN layer and the average oxygen content (=O/(Ti+C+N+O)×100) in a region with a depth of greater than 500 nm, were measured by the Auger electron spectroscopy analyzer. An electron beam with a diameter of 10 nm was irradiated toward a polished cross-section perpendicular to the tool body of the coated tool in a region at a distant corresponding to the layer thickness of a Ti carbonitride layer from the outermost surface of the Ti carbonitride layer as the outermost layer of the lower layer. The intensities of Auger peaks of Ti, C, N, and O were measured. The ratio of the Auger peaks of O was calculated based on the sum of the peak intensities. A value obtained by subtracting the unavoidable oxygen content from the ratio was obtained as the oxygen content of the TiCN layer as the outermost layer. The values are shown in Tables 8 and 10.

Next, an inclination angle frequency distribution graph was plotted for the Al$_2$O$_3$ layer of the intermediate layer of the hard coating layer using a field-emission-type scanning electron microscope. The ratio of the sum of frequencies of the measured inclination angles in a range of 0 to 10° was obtained.

First, regarding the intermediate layer of the invention coated tools 1 to 13 and the comparative coated tools 1 to 13, a measurement range (0.3 μm×50 μm) of the polished cross-section of 0.3 μm in the layer thickness direction thereof by 50 μm in a direction parallel to the surface 1 of the tool body was set in a lens barrel of the field-emission-type scanning electron microscope. Secondly, an electron beam was irradiated toward each of the crystal grains with a hexagonal crystal lattice in the measurement range of each of the polished cross-section at an incident angle of 70° relative to the polished cross-section at an acceleration voltage of 15 kV and an irradiating current of 1 nA. More specifically, using an electron backscatter diffraction-imaging device, an electron beam were irradiated toward a measurement area of 0.3 μm×50 μm at an interval of 0.1 μm/step, and an inclination angles between the normal line L1 to the surface 1 of the tool body and the normal lines L2 to the (0001) planes as the crystal plane of the crystal grain was measured for each crystal grain, while the measured inclination angles belonging to a range of 0 to 45° were divided into every pitch of 0.25°. The frequencies in each division were counted to plot an inclination angle frequency distribution graph. On the basis of the inclination angle frequency distribution graph, the ratio of the sum of frequencies of the measured inclination angles in a range of 0 to 10° to the total frequencies in the inclination angle frequency distribution graph, was obtained. The values are shown in Tables 9 and 11.

In this example, in the layer formed of the Al$_2$O$_3$ grains, a distance from the interface with the lower layer to the target layer thickness of the intermediate layer was evaluated as the intermediate layer. A method of specifying the interface between the intermediate layer and the upper layer is not limited thereto, and by inspecting a Zr-containing region and specifying the boundary between the region containing Zr and a region containing no Zr, this boundary may be determined as the boundary between the upper layer and the intermediate layer.

Furthermore, for the entirety of the intermediate layer and the upper layer of the hard coating layer of the invention coated tools 1 to 13 and the comparative coated tools 1 to 13, in the same manner as the intermediate layer, an inclination angle frequency distribution graph was plotted using the field-emission-type scanning electron microscope, and the ratio of the sum of frequencies of the measured inclination angles in a range of 0 to 10° was obtained.

That is, regarding the entirety of Al$_2$O$_3$ grains toward the surface of the hard coating layer from immediately on the interface between the lower layer and the intermediate layer, using the electron backscatter diffraction-imaging device, an electron beam was irradiated to each of the crystal grains with a hexagonal crystal lattice in a measurement range of 30 μm×50 μm in the polished cross-section at an interval of 0.1 μm/step, measurement was performed at an observation magnification of 10,000×, and an inclination angle between the normal line to the surface of the tool body and the normal line to the (0001) plane as the crystal plane of the crystal grain was measured for each crystal grain while the measured inclination angles belonging to a range 0 to 45° were divided into every pitch of 0.25°. The frequencies in each division were counted to plot an inclination angle frequency distribution graph. On the basis of the inclination angle frequency distribution graph, the ratio of the sum of frequencies of the measured inclination angles in a range of 0 to 10° to the total frequencies in the inclination angle frequency distribution graph, was obtained.

The values are shown in Tables 9 and 11.

Next, regarding the Zr-containing Al$_2$O$_3$ layers as the upper layers of the invention coated tools 1 to 13 and the Zr-containing Al$_2$O$_3$ layers of the comparative coated tools 1 to 13, the grain structure was investigated using the field-emission-type scanning electron microscope and the electron backscatter diffraction-imaging device.

First, the Zr-containing Al$_2$O$_3$ layer of the invention coated tools 1 to 13 and the Zr-containing Al$_2$O$_3$ layer of the comparative coated tools 1 to 13 were observed by the field-emission-type scanning electron microscope, and a crystal grain structure with crystal grains having a large grain size with a flat polygonal shape (including a hexagonal shape) represented by FIG. 3A and a vertically long shape was observed. FIG. 3A is a schematic view of a structure with crystal grains having a large grain size with a flat hexagonal shape and a vertically long shape in the invention coated tool 1 viewed in a plane perpendicular to the layer thickness direction. FIG. 3B is a schematic view of a longitudinal sectional structure of the invention coated tool 1 viewed in a direction orthogonal to the layer thickness direction.

Figure 5A:
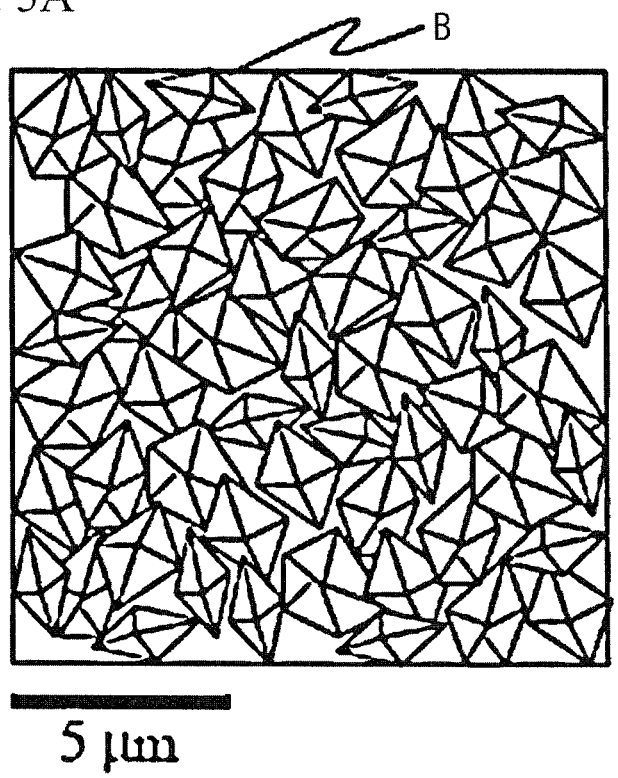
FIG. 5A is a schematic view showing a polygonal grain structure of an conventional upper layer including a Zr-containing α-$Al_2O_3$ layer in a comparative coated tool 1, which is observed by the field-emission-type scanning electron microscope in the plane perpendicular to the layer thickness direction.
Figure 5B:
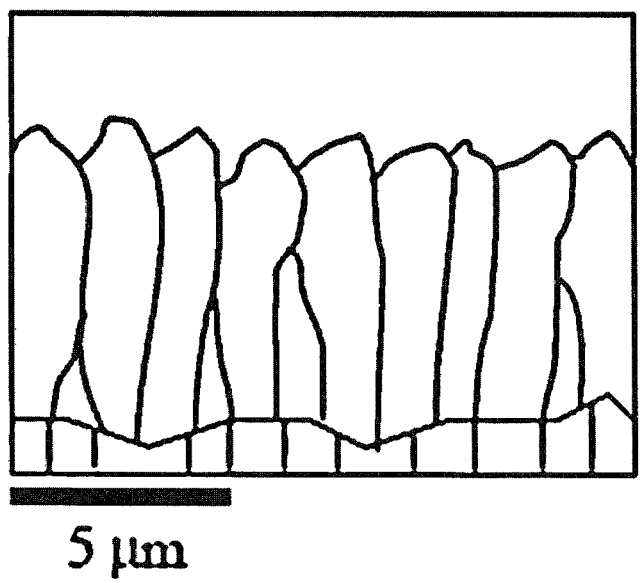
FIG. 5B is a schematic view showing a grain structure having a convex and concave with polygonal pyramid shapes on the surface of the layer and a vertically long shape along the layer thickness direction, which is observed by the field-emission-type scanning electron microscope in the plane parallel to the layer thickness direction.

In the comparative coated tools 1 to 13, as representatively shown in FIGS. 5A and 5B, although a structure of the crystal grains with a hexagonal shape and a vertically long shape was observed, the grain size of each crystal grain in the plane orthogonal to the layer thickness direction was smaller than that in the present invention. In addition, as clearly shown from FIG. 5B, pyramid-shaped convex and concave portions were formed on the surface of the layer. FIGS. 5A and 5B are schematic view of the structure of the comparative coated tool 1.

Next, regarding the $Al_2O_3$ layer of the intermediate layer and the Zr-containing $Al_2O_3$ layer of the upper layer of the invention coated tools 1 to 13, and the $Al_2O_3$ layer of the intermediate layer and the Zr-containing $Al_2O_3$ layer of the upper layer of the comparative coated tools 1 to 13, the area ratio of crystal grains having crystal lattice interfaces (Σ3 coincidence site lattice interface) with the constituent atom-sharing lattice point type expressed as Σ3 therein, was measured.

First, in a state where the cross sections of the $Al_2O_3$ layer of the intermediate layer and the Zr-containing $Al_2O_3$ layer of the upper layer of the invention coated tools 1 to 13 were polished, they were set in the lens barrel of the field-emission-type scanning electron microscope. An electron beam was irradiated to each of the crystal grains with a hexagonal crystal lattice in the measurement range of each of the polished cross-sections at an incident angle of 70° relative to the polished cross-section at an acceleration voltage of 15 kV and an irradiating current of 1 nA. More specifically, using the electron backscatter diffraction-imaging device, an electron beam was irradiated to an area of 30 μm×50 μm at an interval of 0.1 μm/step, an angle at between the normal line to each plane of the crystal lattices constituting the crystal grain and the normal line to the surface of the tool body was measured for each measurement point to which the electron beam was irradiated. Based on the measurement results, the relationship of crystal orientation between the crystal lattices at the adjacent measurement points was calculated. Based on the calculation results, a set of measurement points surrounded by grain boundary with the difference of 5° or greater between the orientations of adjacent crystal grains was specified as a single crystal grain, and all of the crystal grains was specified. In addition, a distribution of lattice points (constituent atom-sharing lattice points) at which constituent atoms forming the crystal lattice interface share a single constituent atom between the crystal lattices was calculated. In addition, a distribution state of the crystal lattice interfaces (Σ3 coincidence site lattice interface) with the constituent atom-sharing lattice point type expressed as Σ3 was obtained, in a case where ΣN+1 represents constituent atom-sharing lattice point type in which there are N lattice points sharing no constituent atoms between the constituent atom-sharing lattice points (here, N is an even number of 2 or higher in a crystal structure of a corundum-type hexagonal close-packing crystal, and N does not include 4, 8, 14, 24, and 26 when the upper limit of N is set to 28 in view of distribution frequency). The crystal grains in the measurement range were identified through color identification, the area of each crystal grain was calculated, and the area of crystal grains having one or more Σ3 coincidence site lattice interface therein was obtained. The ratio of the area of crystal grains having the Σ3 coincidence site lattice interface therein to the area of the measurement range was obtained. The same measurement was performed on a range (30 μm×50 μm) of five points, and the average value thereof was shown as the ratio (%) of the Σ3 coincidence site lattice interface in Table 9.

Next, for the $Al_2O_3$ layer of the intermediate layer and the Zr-containing $Al_2O_3$ layer of the upper layer of the comparative coated tools 1 to 13, the ratio of the Σ3 coincidence site lattice interface was also obtained in the same method as that in the case of the invention coated tools 1 to 13. That is, the area ratio of crystal grains where one or more Σ3 coincidence site lattice interface were present to all the crystal grains in the measurement range of the $Al_2O_3$ layer of the intermediate layer and the Zr-containing $Al_2O_3$ layer of the upper layer was obtained, and the value was shown as the ratio (%) of the Σ3 coincidence site lattice interface in Table 11.

As shown in Tables 9 and 11, in the $Al_2O_3$ layer of the intermediate layer and the Zr-containing $Al_2O_3$ layer of the upper layer of the invention coated tools 1 to 13, the area ratio of the crystal grains having one or more crystal lattice interfaces (Σ3 coincidence site lattice interface) with the constituent atom-sharing lattice point type expressed as Σ3 therein, that is, the ratio of the Σ3 coincidence site lattice interface was 70% or more. On the other hand, it was seen that the ratio of the Σ3 coincidence site lattice interface was less than 70% in the $Al_2O_3$ layer of the intermediate layer and the Zr-containing $Al_2O_3$ layer of the upper layer of the comparative coated tools 2, 4 to 7, and 9 to 13, and the ratio of crystal lattice interfaces having the constituent atom-sharing lattice point type expressed as Σ3 in the crystal grains was very low.

In addition, on the surface of the Zr-containing $Al_2O_3$ layer as the upper layer of the invention coated tools 1 to 13 and the surface of the Zr-containing $Al_2O_3$ layer as the upper layer of the comparative coated tools 1 to 13, the shapes of crystal grains were measured at an observation magnification of 5000× using the field-emission-type scanning electron microscope. In addition, the ratio of the area of crystal grains with a flat hexagonal shape, which were present on the surface of the upper layer, that is, the plane perpendicular to the layer thickness direction, to the area of the observation region was obtained. The values are shown in Tables 9 and 11.

Here, "crystal grains having a hexagonal shape" mentioned herein will be described. When the diameter of a crystal grain in the plane (the surface of the upper layer) perpendicular to the layer thickness direction observed by the field-emission-type scanning electron microscope was measured, the length of the longest line segment among line segments which connected certain apexes to each other was measured, and the average value of the lengths of the three longest line segments was determined to be the diameter of a single crystal grain with a hexagonal shape. A crystal grain having a polygonal shape in which the value of the diameter was 3 to 8 μm and six apex angles had the angles thereof of 100 to 140° was determined as the crystal grain with a hexagonal shape.

In addition, a "flat" surface means that, as shown in FIGS. 3A and 3B, a polygonal pyramid in which a polygon with the grain boundary B of FIG. 3A as its side was formed as the basal plane was not formed on the surface of the vapor-deposited layer. More specifically, it means that the apex of a polygonal pyramid in FIG. 3A was not formed in the vicinity of the intersection of the diagonals of a polygon.

In a case where the surface of crystal grains constituting the surface of the vapor-deposited layer had a polygonal pyramid shape in which the polygon with the grain boundary B as its side was formed as the basal plane as shown in FIGS. 5A and 5B, or in a case where the apex of a polygonal pyramid was formed in the vicinity of the intersection of the diagonals of a polygon as shown in FIG. 5A, it was determined that the surface was not flat.

The thicknesses of the constituent layers of the hard coating layer of the invention coated tools 1 to 13 and the comparative coated tools 1 to 13 were measured using a scanning electron microscope. For the polished cross-sections, the layer thickness of each of the layers was measured at five points, and the average value thereof was obtained. All of the average layer thicknesses were substantially the same as the target layer thicknesses.

TABLE 1

| | | Composition (mass %) | | | | | | |
|---|---|---|---|---|---|---|---|---|
| Type | | Co | TiC | ZrC | TaC | NbC | $Cr_3C_2$ | TiN | WC |
| Tool body | A | 5.3 | 1.5 | — | 2.0 | 1.0 | — | 1.0 | Balance |
| | B | 5.7 | — | 1.0 | 0.5 | 1.0 | — | — | Balance |
| | C | 6.3 | — | — | — | 2.3 | 0.3 | — | Balance |
| | D | 8.5 | 2.0 | — | 1.0 | — | — | 1.5 | Balance |
| | E | 10.7 | 2.2 | — | — | 2.0 | 0.2 | — | Balance |

TABLE 2

| | | Composition (mass %) | | | | | | | |
|---|---|---|---|---|---|---|---|---|---|
| Type | | Co | Ni | ZrC | TaC | NbC | $Mo_2C$ | WC | TiCN |
| Tool body | a | 11.5 | 5.0 | — | 8.0 | — | 10.5 | 12.0 | Balance |
| | b | 8.5 | 7.2 | — | 2.4 | — | 5.8 | — | Balance |
| | c | 7.0 | — | 2.0 | — | 1.5 | 5.0 | 9.5 | Balance |
| | d | 10.0 | 5.5 | — | 9.5 | 1.0 | 6.5 | 11.0 | Balance |
| | e | 12.0 | 4.5 | 1.0 | 6.5 | — | 8.5 | 8.0 | Balance |

TABLE 3

| Hard coating layer (lower layer) | | Forming conditions (in reaction atmosphere, pressure is expressed as kPa, and temperature is expressed as ° C.) | | |
|---|---|---|---|---|
| Type | Composition (numbers indicate atomic ratio) | Reaction gas composition (volume %) | Reaction atmosphere Pressure | Temperature |
| TiC layer | TiC | $TiCl_4$: 4.2%, $CH_4$: 8.5%, $H_2$: balance | 7 | 1020 |
| TiN layer (first layer) | TiN | $TiCl_4$: 4.2%, $N_2$: 30%, $H_2$: balance | 30 | 900 |
| TiN layer (other layers) | TiN | $TiCl_4$: 4.2%, $N_2$: 35%, $H_2$: balance | 50 | 1040 |
| l-$TiC_{0.5}N_{0.5}$ layer | $TiC_{0.5}N_{0.5}$ | $TiCl_4$: 4.2%, $N_2$: 20%, $CH_3CN$: 0.6%, $H_2$: balance | 7 | 900 |
| TiCN layer | $TiC_{0.5}N_{0.5}$ | $TiCl_4$: 4.2%, $N_2$: 20%, $CH_4$: 4%, $H_2$: balance | 12 | 1020 |
| TiCO layer | $TiC_{0.5}O_{0.5}$ | $TiCl_4$: 4.2%, CO: 4%, $H_2$: balance | 7 | 1020 |
| TiCNO layer | $TiC_{0.3}N_{0.3}O_{0.4}$ | $TiCl_4$: 4.2%, CO: 3%, $CH_4$: 3%, $N_2$: 20%, $H_2$: balance | 20 | 1020 |

TABLE 4

| Oxygen-containing TiCN layer type | Forming conditions (in reaction atmosphere, pressure is expressed as kPa, and temperature is expressed as ° C.) | | | CO gas added for 5 to 30 minutes before the end of vapor-deposition (volume %) |
|---|---|---|---|---|
| | Reaction gas composition (volume %) | Reaction atmosphere Pressure | Temperature | |
| A | $TiCl_4$: 4%, $CH_3CN$: 1.5%, $N_2$: 40%, $H_2$: balance | 7 | 870 | 5 |
| B | $TiCl_4$: 10%, $CH_3CN$: 2%, $N_2$: 60%, $H_2$: balance | 6 | 900 | 3 |
| C | $TiCl_4$: 2.5%, $CH_3CN$: 0.5%, $N_2$: 60%, $H_2$: balance | 10 | 800 | 1 |
| D (outside of the present invention) | $TiCl_4$: 2%, $CH_3CN$: 1.2%, $N_2$: 40%, $H_2$: balance | 8 | 800 | 10 |
| E (outside of the present invention) | Without oxygen-containing TiCN layer | — | — | — |

TABLE 5

| Lower layer oxidation process type | Etching conditions (in reaction atmosphere, pressure is expressed as kPa, and temperature is expressed as ° C.) | | |
|---|---|---|---|
| | Reaction gas composition (volume %) | Pressure | Temperature |
| A | CO: 10%, $CO_2$: 10%, $H_2$: balance | 15 | 1040 |
| B | CO: 7%, $CO_2$: 7%, $H_2$: balance | 7 | 1000 |
| C | CO: 5%, $CO_2$: 5%, $H_2$: balance | 5 | 980 |
| D (outside of the present invention) | CO: 3%, $CO_2$: 3%, $H_2$: balance | 7 | 1000 |

TABLE 6

| $\alpha$-$Al_2O_3$ layer Forming conditions (in reaction atmosphere, pressure is expressed as kPa, and temperature is expressed as ° C.) | | | | |
|---|---|---|---|---|
| Forming symbol | | Reaction gas composition (volume) | Reaction atmosphere Pressure | Temperature |
| A | First stage | $AlCl_3$: 2.0%, $CO_2$: 1.0%, $H_2$: balance | 7 | 1000 |
| | Second stage | $AlCl_3$: 2.0%, $CO_2$: 5.0%, HCl: 2.0%, $H_2S$: 0.75%, $H_2$: balance | 7 | 1000 |
| B | First stage | $AlCl_3$: 1.0%, $CO_2$: 1.0%, $H_2$: balance | 15 | 1040 |
| | Second stage | $AlCl_3$: 1.0%, $CO_2$: 3.0%, HCl: 1.0%, $H_2S$: 0.25%, $H_2$: balance | 15 | 1040 |

TABLE 6-continued

α-Al$_2$O$_3$ layer
Forming conditions (in reaction atmosphere, pressure is expressed as kPa, and temperature is expressed as °C.)

| Forming symbol | | Reaction gas composition (volume) | Reaction atmosphere Pressure | Reaction atmosphere Temperature |
|---|---|---|---|---|
| C | First stage | AlCl$_3$: 3.0%, CO$_2$: 5.0%, H$_2$: balance | 5 | 980 |
| | Second stage | AlCl$_3$: 3.0%, CO$_2$: 10.0%, HCl: 3.0%, H$_2$S: 1.00%, H$_2$: balance | 5 | 980 |
| D (outside of the present invention) | First stage | AlCl$_3$: 4.0%, CO$_2$: 4.0%, H$_2$: balance | 7 | 1020 |
| | Second stage | AlCl$_3$: 4.0%, CO$_2$: 8.0%, HCl: 2.0%, H$_2$S: 0.50%, H$_2$: balance | 7 | 1020 |

TABLE 7

Zr-containing Al$_2$O$_3$ layer

Forming conditions (in reaction atmosphere, pressure is expressed as kPa, and temperature is expressed as °C.)

| Formation symbol | | Value of X in (Al$_{1-X}$Zr$_X$)$_2$O$_3$ | Reaction gas composition (volume %) | Reaction atmosphere Pressure | Reaction atmosphere Temperature |
|---|---|---|---|---|---|
| A | First stage | 0.001 | AlCl$_3$: 2.0%, ZrCl$_4$: 0.08%, HCl: 2.0%, CO$_2$: 5.0%, H$_2$S: 0.25%, H$_2$: balance | 7 | 960 |
| | Second stage | | AlCl$_3$: 2.0%, ZrCl$_4$: 0.4%, HCl: 2.0%, CO$_2$: 5.0%, H$_2$S: 0.25%, H$_2$: balance | 7 | 960 |
| B | First stage | 0.0002 | AlCl$_3$: 5.0%, ZrCl$_4$: 0.03%, HCl: 5.0%, CO$_2$: 3.0%, H$_2$S: 0.50%, H$_2$: balance | 10 | 980 |
| | Second stage | | AlCl$_3$: 5.0%, ZrCl$_4$: 0.3%, HCl: 5.0%, CO$_2$: 3.0%, H$_2$S: 0.50%, H$_2$: balance | 10 | 980 |
| C | First stage | 0.005 | AlCl$_3$: 1.0%, ZrCl$_4$: 0.15%, HCl: 1.0%, CO$_2$: 6.0%, H$_2$S: 0.20%, H$_2$: balance | 5 | 900 |
| | Second stage | | AlCl$_3$: 1.0%, ZrCl$_4$: 1.2%, HCl: 1.0%, CO$_2$: 8.0%, H$_2$S: 0.20%, H$_2$: balance | 5 | 900 |
| D | First stage | 0.0003 | AlCl$_3$: 3.5%, ZrCl$_4$: 0.05%, HCl: 3.5%, CO$_2$: 5.0%, H$_2$S: 0.12%, H$_2$: balance | 15 | 950 |
| | Second stage | | AlCl$_3$: 3.5%, ZrCl$_4$: 0.7%, HCl: 3.5%, CO$_2$: 7.0%, H$_2$S: 0.25%, H$_2$: balance | 15 | 950 |
| E | First stage | 0.003 | AlCl$_3$: 1.5%, ZrCl$_4$: 0.1%, HCl: 1.5%, CO$_2$: 4.0%, H$_2$S: 0.25%, H$_2$: balance | 7 | 930 |
| | Second stage | | AlCl$_3$: 1.5%, ZrCl$_4$: 0.1%, HCl: 1.5%, CO$_2$: 6.0%, H$_2$S: 0.50%, H$_2$: balance | 7 | 930 |
| F: outside of the present invention | First stage | 0.00005 | AlCl$_3$: 2.0%, ZrCl$_4$: 0.01%, HCl: 2.0%, CO$_2$: 6.0%, H$_2$S: 0.25%, H$_2$: balance | 10 | 960 |
| | Second stage | | AlCl$_3$: 2.0%, ZrCl$_4$: 0.2%, HCl: 2.0%, CO$_2$: 6.0%, H$_2$S: 0.25%, H$_2$: balance | 10 | 960 |
| G: outside of the present invention | First stage | 0.01 | AlCl$_3$: 2.5%, ZrCl$_4$: 0.2%, HCl: 2.5%, CO$_2$: 5.0%, H$_2$S: 0.37%, H$_2$: balance | 7 | 930 |
| | Second stage | | AlCl$_3$: 2.5%, ZrCl$_4$: 1.5%, HCl: 2.5%, CO$_2$: 5.0%, H$_2$S: 0.37%, H$_2$: balance | 7 | 930 |

* In the second stage, vapor-deposition was performed until target layer thickness was achieved.

TABLE 8

Hard coating layer
Lower layer (Ti compound layer) (The number in parentheses is target layer thickness (μm))

| Type | | Tool body symbol | First layer | Second layer | Third layer | Fourth layer | Oxygen-containing TiCN layer type | Layer thickness (μm) | Average oxygen content in region with depth of 500 nm or less (at %) |
|---|---|---|---|---|---|---|---|---|---|
| Invention coated tools | 1 | A | TiN (0.5) | I—TiCN (6.5) | — | — | A | 0.5 | 2.8 |
| | 2 | a | TiC (0.5) | TiCN (3) | I—TiCN (6) | — | B | 1.2 | 1.5 |
| | 3 | b | TiC (1) | I—TiCN (4) | TiCO (0.5) | — | C | 1.0 | 0.6 |
| | 4 | B | TiN (0.5) | TiCN (7) | I—TiCN (5) | — | B | 0.8 | 1.7 |
| | 5 | C | TiN (1) | TiCN (2) | TiCNO (0.5) | — | A | 0.6 | 3.0 |
| | 6 | c | TiC (1) | I—TiCN (10) | TiN (1) | TiCN (7) | C | 0.9 | 0.5 |
| | 7 | d | TiN (1) | I—TiCN (6) | TiN (0.5) | — | C | 1.3 | 0.8 |
| | 8 | D | TiC (0.5) | TiN (0.5) | I—TiCN (7) | — | A | 0.5 | 2.4 |
| | 9 | E | TiN (1) | TiCN (11) | TiC (1) | — | B | 1.5 | 1.3 |

TABLE 8-continued

| | | Hard coating layer Lower layer (Ti compound layer) (The number in parentheses is target layer thickness (μm)) | | | | | | |
|---|---|---|---|---|---|---|---|---|
| | Tool | | | | | Oxygen-containing TiCN layer at outermost surface of lower layer | | |
| Type | body symbol | First layer | Second layer | Third layer | Fourth layer | Oxygen-containing TiCN layer type | Layer thickness (μm) | Average oxygen content in region with depth of 500 nm or less (at %) |
| 10 | e | TiN (0.5) | I—TiCN (1.5) | — | — | B | 1.0 | 1.8 |
| 11 | A | TiC (1) | I—TiCN (10) | — | — | C | 1.3 | 0.9 |
| 12 | C | TiN (0.5) | TiCN (5) | TiN (1) | I—TiCN (7) | A | 0.8 | 2.7 |
| 13 | b | TiN (1) | I—TiCN (8) | — | — | B | 1.5 | 1.7 |

TABLE 9

| | | Hard coating layer (intermediate layer, upper layer) | | | | | | |
|---|---|---|---|---|---|---|---|---|
| | | Intermediate layer (α-Al₂O₃ layer) | | | | | Upper layer (Zr-containing α-Al₂O₃ layer) | |
| Type | Tool body symbol | Lower layer oxidation process type | α-Al₂O₃ layer formation symbol | Layer thickness (μm) | Inclination angle division where highest peak exists (°) | Ratio of frequencies of inclination angle divisions at 0 to 10° to total frequencies (%) | Formation symbol | Layer thickness (μm) |
| Invention coated tools | 1 | A | B | A | 2.0 | 3.00-3.25 | 70 | A | 5.0 |
| | 2 | a | A | C | 1.5 | 4.25-4.50 | 59 | B | 3.5 |
| | 3 | b | C | B | 2.0 | 7.75-8.00 | 53 | C | 15.0 |
| | 4 | B | A | B | 3.0 | 6.25-6.50 | 58 | D | 3.5 |
| | 5 | C | B | C | 0.5 | 9.25-9.50 | 51 | E | 8.0 |
| | 6 | c | C | A | 3.0 | 1.25-1.50 | 66 | F | 4.5 |
| | 7 | d | C | C | 2.5 | 2.00-2.25 | 70 | A | 6.0 |
| | 8 | D | A | B | 1.0 | 4.25-4.50 | 64 | D | 2.0 |
| | 9 | E | B | B | 2.5 | 5.50-5.75 | 57 | E | 3.0 |
| | 10 | e | B | C | 2.0 | 3.75-4.00 | 61 | B | 7.0 |
| | 11 | A | C | A | 5.0 | 0.75-1.00 | 68 | C | 2.0 |
| | 12 | C | A | A | 2.0 | 3.50-3.75 | 65 | G | 3.0 |
| | 13 | b | B | B | 2.5 | 1.75-2.00 | 60 | B | 4.0 |

| | | Hard coating layer (intermediate layer, upper layer) | | | | | |
|---|---|---|---|---|---|---|---|
| | | Upper layer (Zr-containing α-Al₂O₃ layer) | | Tensile residual stress | | Intermediate layer + upper layer | |
| Type | | Zr content ratio (value of X) | Area ratio of crystal grains with flat hexagonal shape in plane perpendicular to layer thickness (area %) | Presence or absence of wet blasting | Difference in residual stress value between flank face and rake face (MPa) | Inclination angle division where highest peak exists (°) | Ratio of frequencies of inclination angle divisions at 0 to 10° to total frequencies (%) | Ratio of Σ3 coincidence site lattice interface (area %) |
| Invention coated tools | 1 | 0.001 | 61 | Present | 35 | 2.50-2.75 | 83 | 79 |
| | 2 | 0.0002 | 44 | Present | 152 | 3.50-3.75 | 80 | 72 |
| | 3 | 0.005 | 56 | Present | 109 | 5.25-5.50 | 78 | 70 |
| | 4 | 0.0003 | 42 | Absent | 421 | 8.00-8.25 | 76 | 74 |
| | 5 | 0.003 | 53 | Present | 94 | 8.75-9.00 | 75 | 75 |
| | 6 | 0.00005 | 45 | Absent | 223 | 7.25-7.50 | 79 | 72 |
| | 7 | 0.001 | 59 | Present | 54 | 2.50-2.75 | 81 | 80 |
| | 8 | 0.0002 | 53 | Present | 129 | 4.00-4.25 | 76 | 75 |
| | 9 | 0.004 | 40 | Absent | 328 | 6.50-6.75 | 80 | 71 |
| | 10 | 0.0002 | 56 | Present | 61 | 5.00-5.25 | 77 | 80 |
| | 11 | 0.004 | 60 | Present | 140 | 1.75-2.00 | 80 | 71 |

TABLE 9-continued

| | | | | | | | |
|---|---|---|---|---|---|---|---|
| 12 | 0.01 | 48 | Absent | 362 | 8.00-8.25 | 75 | 73 |
| 13 | 0.0003 | 47 | Present | 205 | 4.25-4.50 | 81 | 70 |

TABLE 10

Hard coating layer
Lower layer (Ti compound layer)
(The number in parentheses is target layer thickness (μm))

| Type | | Tool body symbol | First layer | Second layer | Third layer | Fourth layer | Oxygen-containing TiCN layer at outermost surface of lower layer | | |
|---|---|---|---|---|---|---|---|---|---|
| | | | | | | | Oxygen-containing TiCN layer type | Layer thickness (μm) | Average oxygen content in region with depth of 500 nm or less (at %) |
| Comparative coated tools | 1 | A | Same as invention coated tool 1 | | | | *D | 0.5 | 4.2 |
| | 2 | a | Same as invention coated tool 2 | | | | *E | — | — |
| | 3 | b | Same as invention coated tool 3 | | | | A | 1.0 | 2.0 |
| | 4 | B | Same as invention coated tool 4 | | | | C | 0.8 | 0.5 |
| | 5 | C | Same as invention coated tool 5 | | | | B | 0.6 | 1.1 |
| | 6 | c | Same as invention coated tool 6 | | | | *E | — | — |
| | 7 | d | Same as invention coated tool 7 | | | | C | 1.3 | 0.7 |
| | 8 | D | Same as invention coated tool 8 | | | | *D | 0.5 | 3.7 |
| | 9 | E | Same as invention coated tool 9 | | | | B | 1.5 | 1.4 |
| | 10 | e | Same as invention coated tool 10 | | | | A | 1.0 | 0.8 |
| | 11 | A | Same as invention coated tool 11 | | | | *D | 1.0 | 4.0 |
| | 12 | C | Same as invention coated tool 12 | | | | *D | 0.8 | 4.4 |
| | 13 | b | Same as invention coated tool 13 | | | | *E | — | — |

Note:
Fields that are outside of the present invention are marked with *.

TABLE 11

Hard coating layer (intermediate layer, upper layer)

| Type | | Tool body symbol | Lower layer oxidation process type | α-Al₂O₃ layer formation symbol | Intermediate layer (α-Al₂O₃ layer) | | | Upper layer (Zr-containing α-Al₂O₃ layer) | | |
|---|---|---|---|---|---|---|---|---|---|---|
| | | | | | Layer thickness (μm) | Inclination angle division where highest peak exists (°) | Ratio of frequencies of inclination angle divisions at 0 to 10° to total frequencies (%) | Formation symbol | Layer thickness (μm) | Zr content ratio (value of X) |
| Comparative coated tools | 1 | A | B | A | 2.0 | 10.25-10.50 | 45 | A | 5.0 | 0.001 |
| | 2 | a | A | B | 1.5 | 14.00-14.25 | 35 | B | 3.5 | 0.0002 |
| | 3 | b | *D | C | 2.0 | 13.75-14.00 | 37 | C | 15.0 | 0.005 |
| | 4 | B | C | *D | 3.0 | 20.25-20.50 | 22 | D | 3.5 | 0.0003 |
| | 5 | C | *D | A | 0.5 | 11.75-12.00 | 37 | E | 8.0 | 0.003 |
| | 6 | c | A | C | 3.0 | 9.75-10.00 | 55 | *F | 4.5 | 0.00005 |
| | 7 | d | B | *D | 2.5 | 19.00-19.25 | 39 | A | 6.0 | 0.001 |
| | 8 | D | C | B | 1.0 | 17.50-17.75 | 37 | D | 2.0 | 0.0002 |
| | 9 | E | *D | C | 2.5 | 16.75-17.00 | 30 | E | 3.0 | 0.004 |
| | 10 | e | C | *D | 2.0 | 18.25-18.50 | 42 | B | 7.0 | 0.0002 |
| | 11 | A | A | B | 5.0 | 8.75-9.00 | 55 | C | 2.0 | 0.004 |
| | 12 | C | C | C | 2.0 | 13.50-13.75 | 41 | *G | 3.0 | 0.01 |
| | 13 | b | B | A | 2.5 | 12.50-12.75 | 39 | B | 4.0 | 0.0003 |

TABLE 11-continued

| | | Hard coating layer (intermediate layer, upper layer) | | | | | |
|---|---|---|---|---|---|---|---|
| | | Upper layer (Zr-containing α-Al$_2$O$_3$ layer) | | | | Intermediate layer + upper layer | |
| | | Area ratio of crystal grains with flat hexagonal shape in plane perpendicular to layer thickness (area %) | Tensile residual stress | | Ratio of | | |
| Type | | | Presence or absence of wet blasting | Difference in residual stress value between flank face and rake face (MPa) | Inclination angle division where highest peak exists (°) | frequencies of inclination angle divisions at 0 to 10° to total frequencies (%) | Ratio of Σ3 coincidence site lattice interface (area %) |
| Comparative coated tools | 1 | 53 | Present | 123 | 8.75-9.00 | 62 | 72 |
| | 2 | 30 | Present | 196 | 12.25-12.50 | 42 | 40 |
| | 3 | 57 | Present | 107 | 9.25-9.50 | 67 | 78 |
| | 4 | 32 | Absent | 491 | 18.75-19.00 | 29 | 55 |
| | 5 | 47 | Present | 85 | 9.00-9.25 | 59 | 32 |
| | 6 | 23 | Absent | 312 | 11.50-11.75 | 77 | 55 |
| | 7 | 29 | Present | 270 | 15.25-15.50 | 49 | 47 |
| | 8 | 44 | Present | 236 | 15.50-15.75 | 36 | 75 |
| | 9 | 25 | Absent | 330 | 19.25-19.50 | 33 | 42 |
| | 10 | 33 | Present | 199 | 14.00-14.25 | 43 | 47 |
| | 11 | 51 | Present | 140 | 9.25-9.50 | 76 | 64 |
| | 12 | 33 | Absent | 401 | 17.75-18.00 | 45 | 50 |
| | 13 | 22 | Present | 288 | 14.00-14.25 | 38 | 42 |

Note:
Fields that are outside of the present invention are marked with *.

Next, for all of the types of coated tools of the invention coated tools 1 to 13 and the comparative coated tools 1 to 13, in a state where the coated tool was screwed to the tip portion of an insert holder of tool steel by a fixing jig, a high-speed intermittent heavy cutting test was performed under the following cutting conditions A to C. The high-speed intermittent heavy cutting test is a test in which cutting work is performed in the circumferential direction on a round bar in which a plurality of grooves extending in the axial direction (longitudinal direction) are formed on the surface at equal intervals in the circumferential direction during feeding the round bar. In addition, the test was performed by setting a cutting speed, a cutting depth, or/and a feed rate in each of the conditions to be greater than the cutting speed of conventional high-speed intermittent dry cutting work. A conventional cutting speed, cutting depth, and feed rate described in each of the following conditions mean a cutting speed, a cutting depth, and a feed rate which have optimal efficiency (generally means the number of components that can be worked until the end of the service life of the tool or the like) in a case where a conventional coated tool is used.

(Cutting Conditions A: High-Speed Intermittent Wet Heavy Cutting Test of Alloy Steel)

Workpiece: a bar material with four longitudinal grooves formed at equal intervals in the longitudinal direction of JIS SCM440 (corresponding to ISO 683/1-42CrMo4 or ISO 683/1-42CrMoS4)

Cutting speed: 400 m/min (conventional cutting speed: 200 m/min)

Cutting depth: 1.5 mm (conventional cutting depth: 1.5 mm)

Feed rate: 0.3 mm/rev. (conventional feed rate: 0.3 mm/rev.)

Cutting time: 5 minutes (Cutting Conditions B: High-Speed Intermittent Dry Heavy Cutting Test of Nickel-Chromium-Molybdenum Alloy Steel)

Workpiece: a bar material with four longitudinal grooves formed at equal intervals in the longitudinal direction of JIS SNCM439 (corresponding to SAE 4340)

Cutting speed: 300 m/min (conventional cutting speed: 200 m/min)

Cutting depth: 2.0 mm (conventional cutting depth: 1.5 mm)

Feed rate: 0.3 mm/rev. (conventional feed rate: 0.25 mm/rev.)

Cutting time: 5 minutes (Cutting Conditions C: High-Speed Intermittent Dry Heavy Cutting Test of Cast Iron)

Workpiece: a bar material with four longitudinal grooves formed at equal intervals in the longitudinal direction of JIS FC300 (corresponding to ISO 185/M/300)

Cutting speed: 400 m/min (conventional cutting speed: 250 m/min)

Cutting depth: 2.0 mm (conventional cutting depth: 1.5 mm)

Feed rate: 0.35 mm/rev. (conventional feed rate: 0.3 mm/rev.)

Cutting time: 5 minutes

Under such conditions, the high-speed intermittent heavy cutting test was performed on the invention coated tools 1 to 13 and the comparative coated tools 1 to 13, and the wear width of the flank face of the cutting edge was measured.

The measurement results are shown in Table 12. The comparative coated tools 1 to 13 had been significantly worn due to causes such as chipping or fracturing of the coating, and the time (minutes) taken until the wear width exceeded 0.5 mm was entered in Table 12. In addition, results for which the end of the service life had been reached due to chipping were marked.

TABLE 12

| Type | | Wear width of flank face (mm) | | | Type | | Cutting test results (minutes) | | |
|---|---|---|---|---|---|---|---|---|---|
| | | Cutting conditions (A) | Cutting conditions (B) | Cutting conditions (C) | | | Cutting conditions (A) | Cutting conditions (B) | Cutting conditions (C) |
| Invention coated tools | 1 | 0.18 | 0.22 | 0.16 | Comparative coated tools | 1 | 2.9 min | 2.8 min | *2.7 min |
| | 2 | 0.21 | 0.24 | 0.20 | | 2 | 2.1 min | 1.6 min | 2.0 min |
| | 3 | 0.15 | 0.18 | 0.17 | | 3 | *2.0 min | *1.8 min | *1.9 min |
| | 4 | 0.22 | 0.21 | 0.20 | | 4 | 2.4 min | 2.3 min | *2.2 min |
| | 5 | 0.19 | 0.20 | 0.22 | | 5 | 2.6 min | 3.2 min | 3.2 min |
| | 6 | 0.28 | 0.27 | 0.27 | | 6 | *1.4 min | *1.6 min | *1.5 min |
| | 7 | 0.19 | 0.21 | 0.20 | | 7 | *1.9 min | 2.1 min | *2.0 min |
| | 8 | 0.25 | 0.28 | 0.27 | | 8 | 3.0 min | 2.7 min | 2.5 min |
| | 9 | 0.22 | 0.21 | 0.25 | | 9 | *2.1 min | *2.0 min | *1.9 min |
| | 10 | 0.18 | 0.18 | 0.20 | | 10 | 2.0 min | 1.9 min | 2.2 min |
| | 11 | 0.19 | 0.21 | 0.19 | | 11 | 2.4 min | 2.2 min | *2.5 min |
| | 12 | 0.25 | 0.27 | 0.25 | | 12 | 2.1 min | *2.0 min | *2.2 min |
| | 13 | 0.21 | 0.23 | 0.21 | | 13 | 2.2 min | 2.3 min | *2.7 min |

The cutting test results of comparative coated tools show the cutting time (minutes) taken until the end of the service life had been reached due to chipping or flank face wear (tool life determination standard: a flank face wear width of 0.5 mm).
In addition, * in fields indicates a case where the end of the service life had been reached due to chipping.

From the results shown in Table 12, it can be seen that all of the invention coated tools 1 to 13 had excellent adhesion between the lower layer, the intermediate layer, and the upper layer. From Table 9, in the invention coated tools 1 to 13, the ratio of the sum of frequencies of the measured inclination angles in a range of 0 to 10° in the inclination angle frequency distribution graph for the intermediate layer was a high ratio of 50 to 70%. Further, the ratio of the sum of frequencies of the measured inclination angles in a range of 0 to 10° in the inclination angle frequency distribution graph for the entirety of the intermediate layer and the upper layer was 75% or more, excellent high-temperature strength was exhibited. In addition, the area ratio of crystal grains in the upper layer having one or more Σ3 coincidence site lattice interface therein was as high as 70% or more. Therefore, even in a case where the coated tool was used under the high-speed intermittent heavy cutting conditions in which high-temperature heat was generated and an high impact load was applied intermittently to the cutting edge, as shown in Table 12, the chipping resistance and peeling resistance of the hard coating layer was excellent, excellent wear resistance was exhibited in long-term usage, and a further increase in the service life was achieved. Furthermore, the upper layer in the invention coated tools 1, 3, 5, 7, 8, 10, and 11 had a crystal grain structure with a flat hexagonal shape. In the upper layer of the invention coated tools 1, 5, 7, and 10, the difference in the tensile residual stress between the flank face and the rake face was as low as 100 MPa or less. Thereby, as shown in Table 12, further excellent wear resistance could be exhibited.

In contrast, as shown in Table 11, in the comparative coated tools 1 to 5, 7 to 10, 12, and 13, the ratio of the sum of frequencies of the measured inclination angles in a range of 0 to 10° in the inclination angle frequency distribution graph for the intermediate layer was not in a range of 50 to 70%, and the ratio of the sum of frequencies of the measured inclination angles in a range of 0 to 10° in the inclination angle frequency distribution graph for the entirety of the intermediate layer and the upper layer was lower than 75%. In addition, in the comparative coated tools 6 and 11, the area ratio of crystal grains having Σ3 coincidence site lattice interfaces therein was less than 70%. Therefore, as shown in Table 12, during the high-speed intermittent heavy cutting work of the comparative coated tools 1 to 13, the end of the service life had been reached within a relatively short period of time due to the occurrence of peeling or chipping of the hard coating layer.

While the preferred examples of the present invention have been described above, the present invention is not limited to the examples. Additions, omissions, and substitutions of the configurations and other changes can be made without departing from the spirit of the present invention. The present invention is not limited to the above description and is limited only by the claims.

In addition, there is no problem if unavoidable impurities are contained in the hard coating layer of the coated tool of the present invention since each layer may substantially have the composition described in the claims.

INDUSTRIAL APPLICABILITY

As described above, the coated tool of the present invention exhibits excellent cutting performance in long-term usage without the occurrence of peeling and chipping of the hard coating layer, even under severe cutting conditions of high-speed intermittent heavy cutting in which a high impact load is applied intermittently to the cutting edge, as well as continuous cutting or intermittent cutting performed under typical conditions of various types of steels, cast iron, or the like. Therefore, the coated tool of the present invention can sufficiently satisfy high performance of cutting apparatuses, power saving and energy saving during cutting work, and a further reduction in cost.

REFERENCE SIGNS LIST

1 SURFACE OF TOOL BODY SURFACE
2 LOWER LAYER
3 INTERMEDIATE LAYER
4 UPPER LAYER
L1 NORMAL LINE TO TOOL BODY SURFACE
L2 NORMAL LINE TO (0001) PLANE
B GRAIN BOUNDARY
B3 Σ3 COINCIDENCE SITE LATTICE INTERFACE

The invention claimed is:

1. A surface-coated cutting tool, comprising:
a tool body made of tungsten carbide-based cemented carbide or titanium carbonitride-based cermet; and
a hard coating layer which is vapor-deposited on a surface of the tool body,
wherein the hard coating layer includes:
(a) a lower layer which is a Ti compound layer including at least one of the group consisting of a Ti carbide layer, a Ti nitride layer, a Ti carbonitride layer, a Ti oxycarbide layer, and a Ti oxycarbonitride layer, and having an average total layer thickness of 3 to 20 μm;
(b) an intermediate layer which is an $Al_2O_3$ layer having an average layer thickness of 0.5 to 5 μm and having an α-crystal structure in a chemically vapor-deposited state; and
(c) an upper layer which is a Zr-containing $Al_2O_3$ layer having an average layer thickness of 2 to 15 μm and having an α-crystal structure in a chemically vapor-deposited state,
(d) an outermost layer of the lower layer is the Ti carbonitride layer having a layer thickness of 500 nm or more, where oxygen is contained only in a region having a depth of 500 nm or less from an interface between the Ti carbonitride layer and the intermediate layer in a layer thickness direction of the Ti carbonitride layer, and an average amount of oxygen contained in the region is 0.5 to 3 at % of a total amount of Ti, C, N, and O contained in the region,
(e) in an inclination angle frequency distribution graph for $Al_2O_3$ grains of the intermediate layer, the highest peak exists in an inclination angle division in a range of 0 to 10° and the ratio of the sum of frequencies in the range of 0 to 10° is 50 to 70% to the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished cross-section of the intermediate layer, measuring inclination angles between the normal line to the surface of the tool body and the normal lines to (0001) planes as a crystal plane of the crystal grains in a range of 0 to 45°, dividing the measured inclination angles belonging to a range of 0 to 45° every pitch of 0.25°, and counting the frequencies in each division,
(f) in an inclination angle frequency distribution graph for $Al_2O_3$ grains of an entirety of the intermediate layer and the upper layer, the highest peak exists in an inclination angle division in a range of 0 to 10° and ratio of the sum of frequencies in the range of 0 to 10° is 75% or more to the total frequencies in the inclination angle frequency distribution graph, the inclination angle frequency distribution graph being obtained by utilizing a field-emission-type scanning electron microscope, irradiating electron beams to individual crystal grains with a hexagonal crystal lattice in a measurement range of a polished cross-section of the intermediate layer and upper layer, measuring inclination angles between the normal line to the surface of the tool body and the normal lines to (0001) planes as a crystal plane of the crystal grains in a range of 0 to 45°, dividing the measured inclination angles belonging to a range of 0 to 45° every pitch of 0.25°, and counting the frequencies in each division, and
(g) regarding the $Al_2O_3$ grains of the intermediate layer and the upper layer, the insides of the crystal grains of which area ratio is 70% or more to the crystal grains constituting both of the intermediate layer and the upper layer, are divided by at least one crystal lattice interface with a constituent atom-sharing lattice point type expressed by Σ3, when electron beams are irradiated to the individual crystal grains in a measurement range of the polished cross-section of the intermediate layer and the upper layer by utilizing a field-emission-type scanning electron microscope and an electron backscatter diffraction-imaging device to measure angles between a normal line to each of crystal lattice faces of hexagonal crystal lattices and the normal line to the surface of the tool body, a crystal orientation relationship between the adjacent crystal lattices is calculated based on the measurement result, and a distribution of lattice points (constituent atom-sharing lattice points) where each of constituent atoms of a crystal lattice interface shares one constituent atom between the crystal lattices is calculated, and when ΣN+1 represents the constituent atom-sharing lattice point type in which there are N lattice points sharing no constituent atoms between the constituent atom-sharing lattice points (here, N is an even number of 2 or higher in a crystal structure of a corundum-type hexagonal close-packing crystal, and N does not include 4, 8, 14, 24, and 26 when the upper limit of N is set to 28 in view of distribution frequency).

2. The surface-coated cutting tool according to claim 1, wherein a value of X satisfies 0.0001≤X≤0.005 in terms of atomic ratio in a case where the Zr-containing $Al_2O_3$ layer constituting the upper layer is expressed as a composition formula of $(Al_{1-X}Zr_X)_2O_3$.

3. The surface-coated cutting tool according to claim 1, wherein an area ratio of crystal grains having a hexagonal shape in a plane perpendicular to the layer thickness direction is 50% or more to a region of which a structure is observed in the plane perpendicular to the layer thickness direction, when a structure of a surface of the Zr-containing $Al_2O_3$ layer constituting the upper layer is observed by the field-emission-type scanning electron microscope.

4. The surface-coated cutting tool according to claim 1, wherein a difference in tensile residual stresses between a flank face and a rake face is 100 MPa or lower, when any one of the rake face and the flank face including at least a cutting edge ridge portion in the Zr-containing $Al_2O_3$ layer constituting the upper layer is polished and residual stresses of the flank face and the rake face are measured.

5. The surface-coated cutting tool according to claim 2, wherein an area ratio of crystal grains having a hexagonal shape in a plane perpendicular to the layer thickness direction is 50% or more to a region of which a structure is observed in the plane perpendicular to the layer thickness direction, when a structure of a surface of the Zr-containing $Al_2O_3$ layer constituting the upper layer is observed by the field-emission-type scanning electron microscope.

6. The surface-coated cutting tool according to claim 2, wherein a difference in tensile residual stresses between a flank face and a rake face is 100 MPa or lower, when any one of the rake face and the flank face including at least a cutting edge ridge portion in the Zr-containing Al$_2$O$_3$ layer constituting the upper layer is polished and residual stresses of the flank face and the rake face are measured.

7. The surface-coated cutting tool according to claim 3, wherein a difference in tensile residual stresses between a flank face and a rake face is 100 MPa or lower, when any one of the rake face and the flank face including at least a cutting edge ridge portion in the Zr-containing Al$_2$O$_3$ layer constituting the upper layer is polished and residual stresses of the flank face and the rake face are measured.

8. The surface-coated cutting tool according to claim 5, wherein a difference in tensile residual stresses between a flank face and a rake face is 100 MPa or lower, when any one of the rake face and the flank face including at least a cutting edge ridge portion in the Zr-containing Al$_2$O$_3$ layer constituting the upper layer is polished and residual stresses of the flank face and the rake face are measured.

* * * * *